(12) United States Patent
Chen et al.

(10) Patent No.: US 9,558,966 B2
(45) Date of Patent: Jan. 31, 2017

(54) SEMICONDUCTOR DEVICE PACKAGES, PACKAGING METHODS, AND PACKAGED SEMICONDUCTOR DEVICES

(71) Applicant: Taiwan Semiconductor Manufacturing Company, Ltd., Hsin-Chu (TW)

(72) Inventors: Hsien-Wei Chen, Hsin-Chu (TW); Chi-Hsi Wu, Hsin-Chu (TW); Chen-Hua Yu, Hsin-Chu (TW); Der-Chyang Yeh, Hsin-Chu (TW); Wei-Cheng Wu, Hsin-Chu (TW); Chien-Fu Tseng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/755,700

(22) Filed: Jun. 30, 2015

(65) Prior Publication Data
US 2016/0013138 A1      Jan. 14, 2016

Related U.S. Application Data

(63) Continuation-in-part of application No. 14/326,249, filed on Jul. 8, 2014.

(51) Int. Cl.
*H01L 23/28* (2006.01)
*H01L 21/56* (2006.01)
(Continued)

(52) U.S. Cl.
CPC ............ *H01L 21/56* (2013.01); *H01L 21/6835* (2013.01); *H01L 21/76838* (2013.01); *H01L 21/78* (2013.01); *H01L 23/12* (2013.01); *H01L 23/3128* (2013.01); *H01L 23/49816* (2013.01); *H01L 23/49827* (2013.01); *H01L 23/5389* (2013.01); *H01L 23/544* (2013.01); *H01L 23/562* (2013.01); *H01L 23/585* (2013.01); *H01L 24/06* (2013.01); *H01L 24/19* (2013.01);
(Continued)

(58) Field of Classification Search
CPC ...... H01L 24/06; H01L 23/528; H01L 23/562; H01L 23/49811; H01L 23/49838; H01L 23/12; H01L 23/58; H01L 23/125
USPC ........................................................ 257/787
See application file for complete search history.

(56) References Cited

U.S. PATENT DOCUMENTS 5,677,576 A * 10/1997 Akagawa ............ H01L 23/5328
                                                               257/737
5,990,546 A    11/1999 Igarashi et al.
(Continued)

*Primary Examiner* — Nitin Parekh
(74) *Attorney, Agent, or Firm* — Slater Matsil, LLP

(57) ABSTRACT

Semiconductor device packages, packaging methods, and packaged semiconductor devices are disclosed. In some embodiments, a package for a semiconductor device includes an integrated circuit die mounting region and a molding material around the integrated circuit die mounting region. An interconnect structure is over the molding material and the integrated circuit die mounting region. A protection pattern is in a perimeter region of the package around the interconnect structure. The protection pattern includes a first conductive feature that is vertical within the package near a second conductive feature. The first conductive feature has a first width, and the second conductive feature has a second width. The second width is greater than the first width.

22 Claims, 17 Drawing Sheets

(51) Int. Cl.

| | | |
|---|---|---|
| *H01L 21/78* | (2006.01) | |
| *H01L 21/683* | (2006.01) | |
| *H01L 21/768* | (2006.01) | |
| *H01L 23/12* | (2006.01) | |
| *H01L 23/00* | (2006.01) | |
| *H01L 23/31* | (2006.01) | |
| *H01L 23/58* | (2006.01) | |
| *H01L 23/498* | (2006.01) | |
| *H01L 23/538* | (2006.01) | |
| *H01L 23/544* | (2006.01) | |
| *H01L 25/065* | (2006.01) | |
| *H01L 25/10* | (2006.01) | |

(52) U.S. Cl.
CPC ............... *H01L 24/20* (2013.01); *H01L 24/97* (2013.01); *H01L 24/32* (2013.01); *H01L 24/48* (2013.01); *H01L 24/73* (2013.01); *H01L 25/0657* (2013.01); *H01L 25/105* (2013.01); *H01L 2221/68372* (2013.01); *H01L 2223/5442* (2013.01); *H01L 2223/54426* (2013.01); *H01L 2223/54486* (2013.01); *H01L 2224/04042* (2013.01); *H01L 2224/04105* (2013.01); *H01L 2224/12105* (2013.01); *H01L 2224/2518* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/14* (2013.01); *H01L 2924/1431* (2013.01); *H01L 2924/1433* (2013.01); *H01L 2924/1434* (2013.01); *H01L 2924/1436* (2013.01); *H01L 2924/15311* (2013.01); *H01L 2924/181* (2013.01); *H01L 2924/18162* (2013.01)

(56) References Cited

U.S. PATENT DOCUMENTS

| | | | | |
|---|---|---|---|---|
| 6,130,823 | A * | 10/2000 | Lauder | H01L 25/105 257/686 |
| 6,495,914 | B1 * | 12/2002 | Sekine | H01L 23/5389 257/706 |
| 6,590,291 | B2 * | 7/2003 | Akagawa | H01L 23/3121 257/686 |
| 7,635,641 | B2 * | 12/2009 | Hurwitz | H01L 21/4857 438/612 |
| 7,682,972 | B2 * | 3/2010 | Hurwitz | H01L 21/4857 438/618 |
| 7,741,194 | B2 * | 6/2010 | Griffiths | H01L 21/6835 257/E21.122 |
| 8,093,704 | B2 | 1/2012 | Palmer et al. | |
| 2008/0237836 | A1 | 10/2008 | Chia et al. | |
| 2009/0261466 | A1 | 10/2009 | Pagaila et al. | |
| 2010/0200975 | A1 | 8/2010 | Chino | |
| 2012/0074586 | A1 | 3/2012 | Seo et al. | |
| 2012/0319295 | A1 | 12/2012 | Chi et al. | |
| 2014/0361411 | A1 | 12/2014 | Yamamichi et al. | |
| 2015/0102829 | A1 * | 4/2015 | Son | G06K 9/00053 324/692 |
| 2015/0123283 | A1 | 5/2015 | Bae et al. | |
| 2015/0294896 | A1 * | 10/2015 | Hurwitz | H01L 25/00 438/15 |
| 2016/0005628 | A1 | 1/2016 | Yap et al. | |

* cited by examiner

SEMICONDUCTOR DEVICE PACKAGES, PACKAGING METHODS, AND PACKAGED SEMICONDUCTOR DEVICES

PRIORITY CLAIM AND CROSS-REFERENCE

This application is a continuation-in-part of, and claims the benefit of, U.S. patent application Ser. No. 14/326,249 filed on Jul. 8, 2014 and entitled, "Semiconductor Device Packages, Packaging Methods, and Packaged Semiconductor Devices," which patent application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
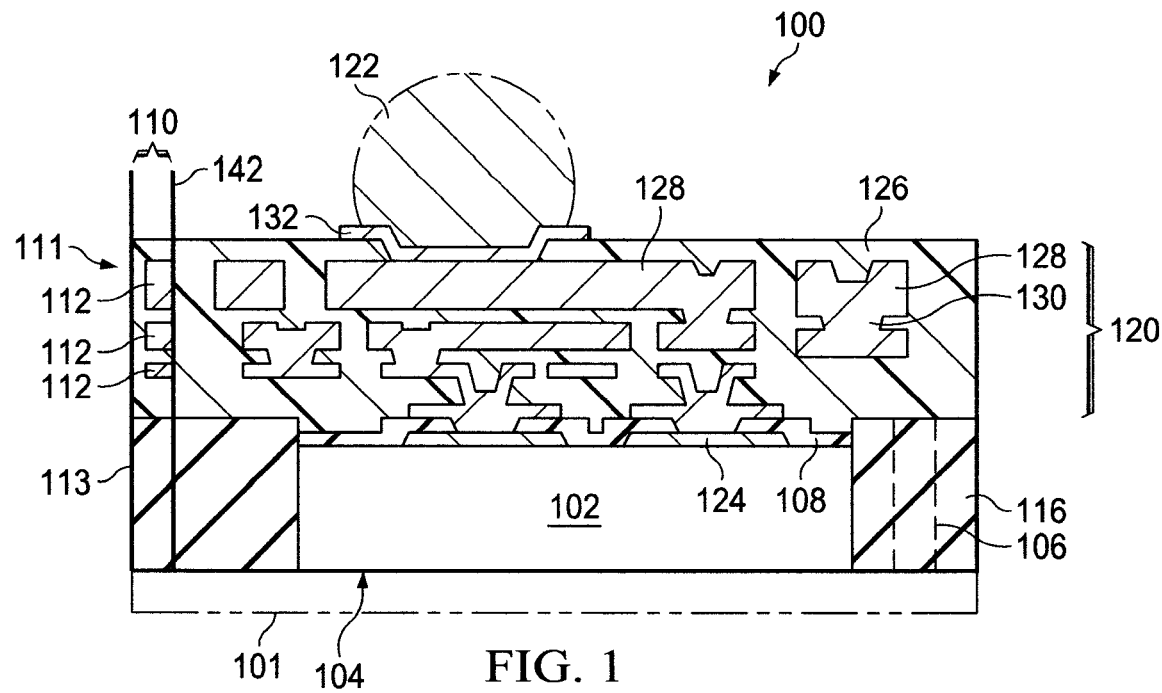
FIG. 1 is a cross-sectional view of a portion of a packaged semiconductor device in accordance with some embodiments of the present disclosure, wherein a protection pattern is formed in a perimeter region of the package.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure provide novel packages for semiconductor devices, methods of packaging semiconductor devices, and packaged semiconductor devices wherein protection patterns are formed in a perimeter region of the package. The protection patterns protect the package area during dicing and may also be used as alignment patterns. In some embodiments, the protect patterns comprise stacked conductive features that have different widths, to be described further herein.

Referring first to FIG. 1, a cross-sectional view of a portion of a packaged semiconductor device 100 in accordance with some embodiments of the present disclosure is shown. The packaged semiconductor device 100 includes a protection pattern 111 that is formed in a perimeter region 110 of the package. The perimeter region 110 comprises a protection pattern area that includes the protection pattern 111. The protection pattern 111 comprises one or more conductive features 112, and comprises a metal pattern in some embodiments, to be described further herein.

The packaged semiconductor device 100 includes an integrated circuit die 102 that is packaged in a package that includes a molding material 116 and an interconnect structure 120 disposed over the integrated circuit die 102 and the molding material 116. The molding material 116 surrounds and encapsulates the integrated circuit die 102. The molding material 116 comprises an insulating material such as a molding compound or an underfill material, as examples. Through-vias 106 are formed in the molding material 116 in some embodiments, as shown in phantom (e.g., in dashed lines) in FIG. 1. Only one through-via 106 is shown in phantom in FIG. 1; however, the packaged semiconductor device 100 may include dozens, hundreds, or more through-vias 106 formed therein. In other embodiments, through-vias 106 are not included within the molding material 116. The interconnect structure 120 is electrically connected to the integrated circuit die 102. The package includes an integrated circuit die mounting region 104 wherein the integrated circuit die 102 is disposed.

The protection pattern 111 is disposed in the perimeter region 110 of the package which is disposed between a package edge 142 and a dicing path 113 of the package. The package edge 142 comprises a region proximate the perimeter region 110 past which no conductive features are formed in the interconnect structure 120, e.g., towards the dicing path 113, in some embodiments. The package edge 142 comprises an enclosure region or edge region of the interconnect structure 120 in some embodiments, for example.

The dicing path 113 comprises a region wherein a plurality of the packaged semiconductor devices 100 will be singulated using a dicing process (e.g., using a saw, laser, or other device) after the packaging process. The dicing path 113 may comprise a scribe line region or a scribe region of a wafer level packaging (WLP) technique in some embodiments, for example. The packaged semiconductor device 100 comprises a WLP in some embodiments, which is formed over a carrier 101, shown in phantom. The carrier 101 is later removed, after the packaging process for the integrated circuit die 102, to be described further herein with reference to FIG. 16. In other embodiments, a carrier 101 may not be included in the packaging process flow.

In some embodiments, the protection pattern 111 is disposed within a material layer that a portion of the interconnect structure 120 is formed in. For example, in FIG. 1, the protection pattern 111 comprises a plurality of conductive features 112 that is disposed in the conductive feature layers, such as conductive line 128 layers and conductive via 130 layers, of the interconnect structure 120. Thus, no additional processing steps or material layers are required to include the conductive features 112 of the protection pattern 111 in the package. Existing lithography masks and packaging processes for the conductive features of the interconnect structure 120 may advantageously be modified to include the protection pattern 111 in the packaged semiconductor device 100. In some embodiments, the interconnect structure 120 comprises a plurality of conductive feature layers, and the plurality of conductive features 112 of the protection pattern 111 is disposed in one or more of the plurality of conductive feature layers of the interconnect structure 120.

Because the conductive features 112 of the protection pattern 111 are formed in the same material layer that conductive features in one or more conductive feature layers of the interconnect structure 120 are formed in, the conductive features 112 of the protection pattern 111 comprise the same material as the conductive features in the conductive feature layer of the interconnect structure 120 in some embodiments. The conductive features 112 comprise a metal in some embodiments, for example. The metal comprises Cu, Al, W, or alloys, combinations, or multiple layers thereof, as examples. The conductive features 112 may also comprise other materials.

In some embodiments, the conductive features 112 of the protection pattern 111 comprise substantially the same size as conductive features in one or more conductive feature layers of the interconnect structure 120. For example, because the conductive features 112 of the protection pattern 111 are formed in the same material layer that conductive features are formed in conductive layers of the interconnect structure 120 are formed in, the conductive features 112 of the protection pattern 111 comprise substantially the same thickness as conductive features in conductive layers of the interconnect structure 120. The conductive features 112 of the protection pattern 111 may also be designed to have substantially the same width as conductive features in conductive layers of the interconnect structure 120.

For example, in some embodiments, a plurality of the conductive features 112 comprises a plurality of first conductive features 112, and a plurality of the conductive feature layers in the interconnect structure 120 comprises a plurality of second conductive features 128 and/or 130 disposed therein. The plurality of first conductive features 112 comprises a first size, and the plurality of second conductive features 128 and/or 130 comprises a second size, the first size being substantially the same as the second size.

The conductive features 112 of the protection pattern 111 may also be designed to have a different width than conductive features in conductive layers of the interconnect structure 120, in some embodiments.

The interconnect structure 120 comprises a redistribution layer (RDL) or a post-passivation interconnect (PPI) structure in some embodiments. The interconnect structure 120 may also comprise other types of wiring structures. The interconnect structure 120 comprises fan-out regions of wiring for the packaged semiconductor device 100 in some embodiments. The fan-out regions of the interconnect structure 120 may provide a larger footprint for the package (e.g., for the under-ball metallization (UBM) structure 132) than the footprint of contacts 124 on the integrated circuit die 102, for example.

In some embodiments, the integrated circuit die 102 includes a plurality of contact pads 124 formed on a surface thereof, and a passivation material 108 is disposed over the integrated circuit die 102 and portions of the contact pads 124. Portions of the interconnect structure 120 are coupled to the contact pads 124 of the integrated circuit die 102 through openings in the passivation material 108. The passivation material 108 may not be included. Portions of the interconnect structure 120 may also be coupled to the through-vias 106, not shown, in embodiments wherein the through-vias 106 are included.

The interconnect structure 120 includes a plurality of insulating material layers 126 in some embodiments. The insulating material layers 126 comprise a polymer or other insulating materials. A plurality of conductive lines 128 and a plurality of conductive vias 130 are disposed within the insulating material layers 126. The interconnect structure 120 may include one or more conductive line 128 layers and one or more via 130 layers, in some embodiments.

The UBM structure 132 is formed over and/or within insulating material layer 126. The UBM structure 132 is coupled to the conductive lines 128 and/or vias 130. Only one UBM structure 132 is shown in FIG. 1; however, a plurality of the UBM structures 132 is formed on the surface of the interconnect structure 120. The conductive features of the interconnect structure 120 comprising the conductive lines 128, vias 130, and the UBM structure 132 may comprise a conductive material such as Cu, Al, W, other metals, or alloys, combinations, or multiple layers thereof, as examples. The conductive features of the interconnect structure 120 comprising the conductive lines 128 and vias 130, and the UBM structure 132 are each formed in a conductive feature layer of the packaged semiconductor device 100. The interconnect structure 120 may also comprise other types of conductive features and may be comprised of other materials.

Connectors 122 (shown in phantom in FIG. 1) are coupled to the UBM structure 132 in some embodiments. A plurality of the connectors 122 are coupled to a plurality of the UBM structures 132 of the interconnect structure 120 in some embodiments, for example. In other embodiments, the connectors 122 are not included in the packaged semiconductor device 100. The connectors 122 comprise a eutectic material and may comprise connectors formed in a ball grid array (BGA) arrangement or other configurations, for example.

Figure 2:
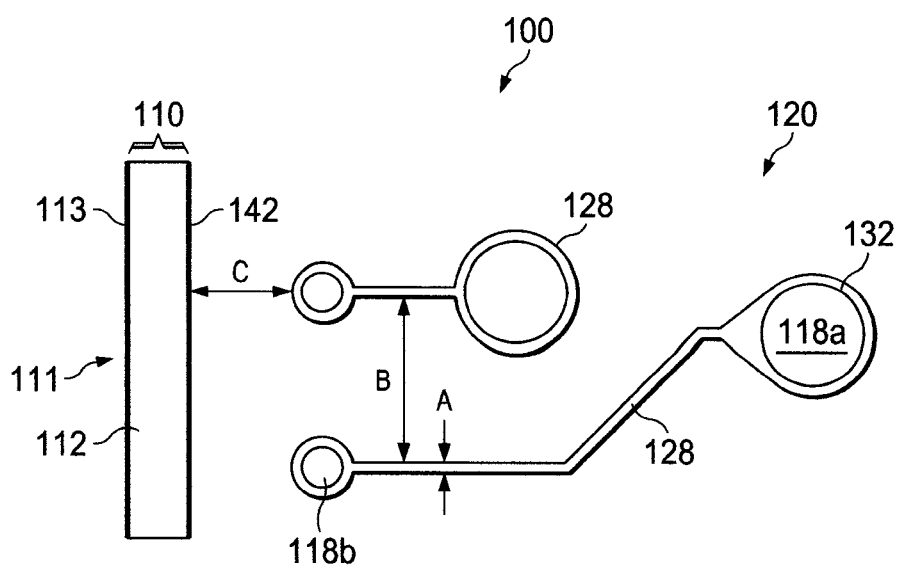
FIG. 2 is a top view illustrating a protection pattern of a packaged semiconductor device in accordance with some embodiments.

FIG. 2 is a top view of the portion of the packaged semiconductor device 100 shown in FIG. 1 in accordance with some embodiments. The protection pattern 111 extends along the package edge 142 of a side of the packaged semiconductor device 100, within the perimeter region 110.

Figure 15:
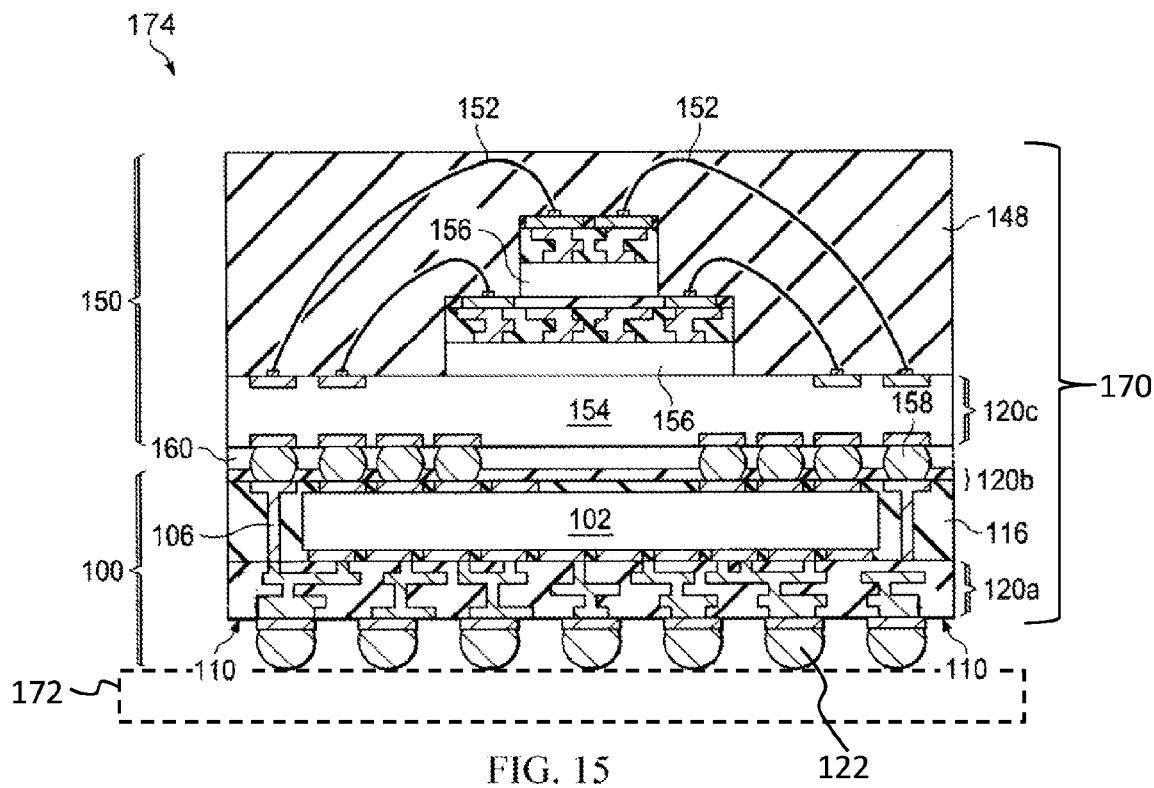
FIG. 15 is a cross-sectional view of a packaged semiconductor device in accordance with some embodiments, wherein a first packaged semiconductor device is coupled to a second packaged semiconductor device.

In some embodiments, the package of the packaged semiconductor device 100 comprises a plurality of sides, and the plurality of conductive features 112 of the protection pattern 111 extends along the package edge 142 of the plurality of sides of the package. For example, two sides of the packaged semiconductor device 100 are shown in FIG. 15. In a top view (not shown), the packaged semiconductor device 100 comprises a shape of a square or rectangle in some embodiments, and the conductive features 112 of the protection pattern extend along the package edge 142 of the four sides of the package within the perimeter region 110, as another example.

Referring again to FIG. 2, a top view of conductive features of the interconnect structure 120 is also shown. Portions of conductive lines 128 and UBM structures 132 and openings 118a and 118b in insulating material 126 are illustrated. Other portions of the insulating material 126 are not shown, so that some portions of conductive lines 128 and UBM structures 132 may be shown, for example. Dimension A comprises a width of conductive lines 128, wherein dimension A comprises about 5 μm to about 10 μm in some embodiments. Dimension B comprises a space between adjacent conductive lines 128, wherein dimension B comprises about 30 μm to about 50 μm in some embodiments. Dimension C comprises the distance between a conductive feature such as conductive line 128 and the package edge 142, wherein dimension C comprises about 20 μm or greater in some embodiments. Dimensions A, B, and C may also comprise other values.

Figure 3:
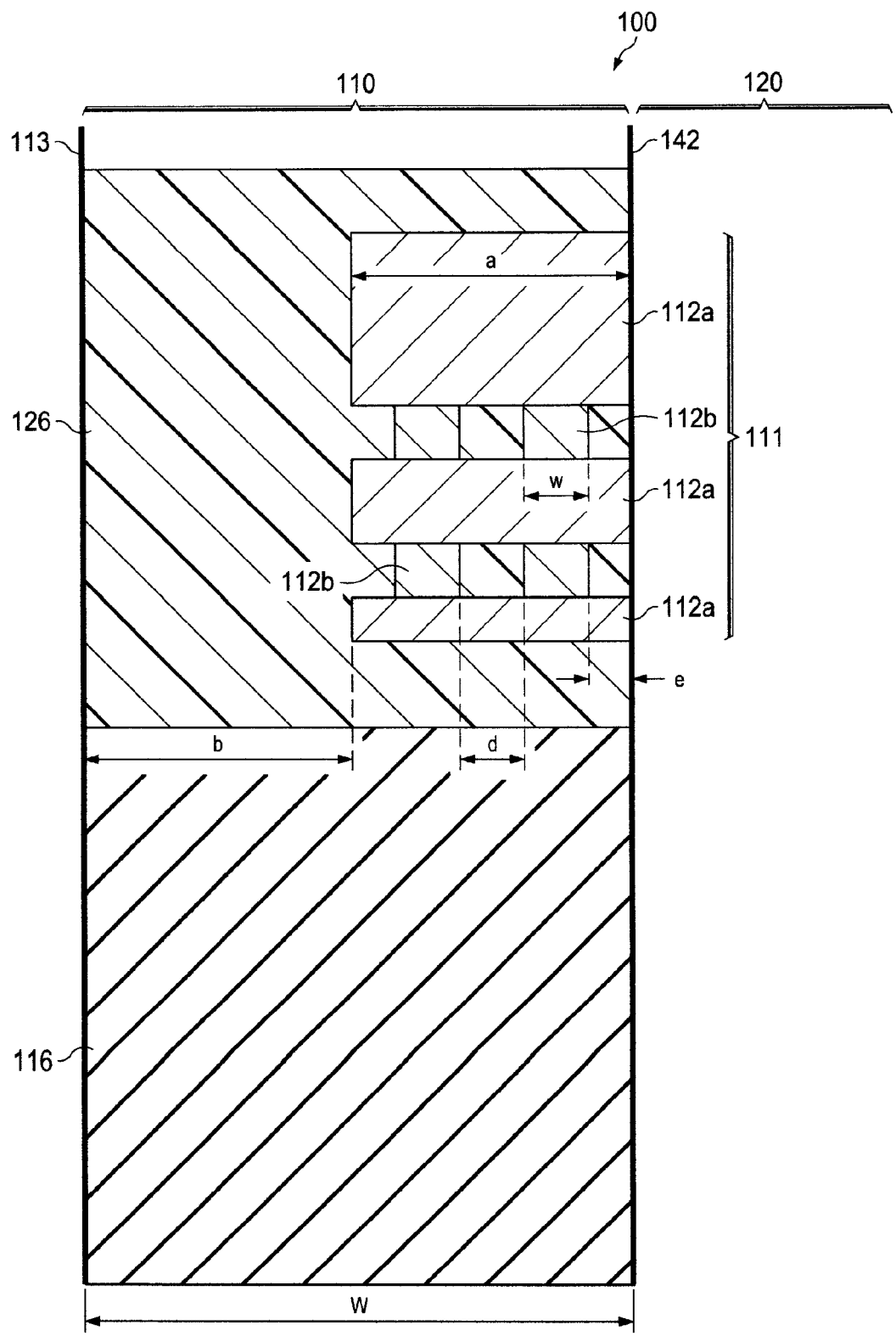
FIG. 3 is a cross-sectional view of a portion of a packaged semiconductor device in accordance with some embodiments of the present disclosure, wherein a protection pattern is formed in conductive feature layers of an interconnect structure in a perimeter region of the package.

FIG. 3 is a cross-sectional view of a portion of a packaged semiconductor device 100 in accordance with some embodiments of the present disclosure, wherein a protection pattern 111 is formed in conductive feature layers of an interconnect structure 120 (not shown in FIG. 3; see FIG. 1) in a perimeter region 110 of the package. The conductive features 112a and 112b are formed in every conductive feature layer of the interconnect structure 120 in the embodiments shown in FIG. 3, for example. In other embodiments, the conductive features 112a and/or 112b are formed in one or more conductive feature layers of the interconnect structure 120.

The conductive features 112a and/or 112b are formed in the same insulating material layers 126 that conductive lines 128 and vias 130 are formed in, in the interconnect structure 120. The molding material 116 is disposed beneath the protection pattern 111 formed in the insulating material layers 126.

Some dimensions of the protection pattern 111 are also shown in FIG. 3. Dimension a comprises a width of a conductive feature 112a of the protection pattern 111 formed in a conductive line 128 layer of an interconnect structure 120, wherein dimension a comprises about 50 μm or less in some embodiments. Dimension a is substantially the same as dimension A of conductive lines 128 in the interconnect structure 120 (see FIG. 2) in some embodiments. Dimension a may also be larger or smaller than dimension A in some embodiments.

Dimension b comprises a distance between a conductive feature 112a or 112b and the dicing path 113, wherein dimension b comprises about 5 μm to about 10 μm in some embodiments. Dimension b is large enough to prevent damage to the protection pattern 111 during a dicing process along the dicing path 113 in some embodiments, for example. In other embodiments, dimension b may be about 0. Dimension b may also comprise other values.

Dimension W comprises a width of the perimeter region 110 that includes the protection region area of the protection pattern 111. Dimension W is equal to (dimension a+dimension b). In some embodiments, dimension W comprises about 5 µm to about 60 µm.

Dimension w comprises a width of a conductive feature 112b of the protection pattern 111 formed in a via 130 layer of an interconnect structure 120, wherein dimension w comprises about 5 µm to about 10 µm in some embodiments. Dimension w is substantially the same as a width of vias 130 formed in a via 130 layer of the interconnect structure 120 in some embodiments. Dimension w may also be larger or smaller than the width of vias 130 in some embodiments.

Dimension d comprises a distance between adjacent conductive features 112b of the protection pattern 111 formed in a via 130 layer of the interconnect structure 120, wherein dimension d comprises about 10 µm or greater in some embodiments. Dimension d is substantially the same as a spacing between vias 130 formed in a via 130 layer of the interconnect structure 120 in some embodiments. Dimension d may also be different than the spacing between vias 130 in some embodiments.

Dimension e comprises a distance between conductive features 112b of the protection pattern 111 formed in a via 130 layer of the interconnect structure 120 and the package edge 142, wherein dimension e comprises about 5 µm or greater in some embodiments. Dimension e also comprises a distance between conductive features 112b and an edge of conductive features 112a formed in a conductive line 128 layer of the interconnect structure 120, for example.

Dimensions a, b, W, w, d, and e may also comprise other values in accordance with some embodiments of the present disclosure.

Figure 4:
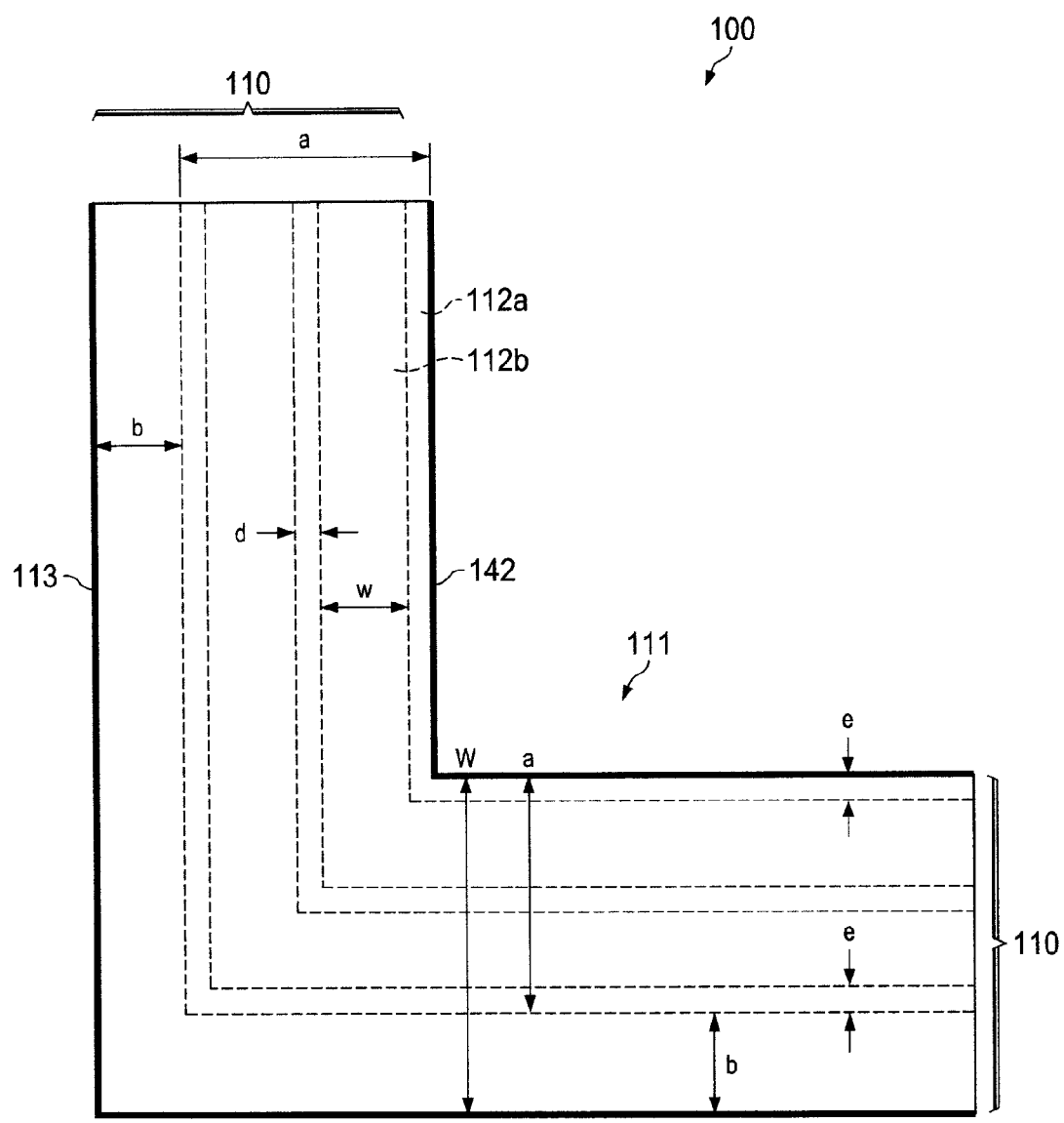
FIG. 4 is a top view of the portion of the packaged semiconductor device shown in FIG. 3 in accordance with some embodiments.
Figure 6:
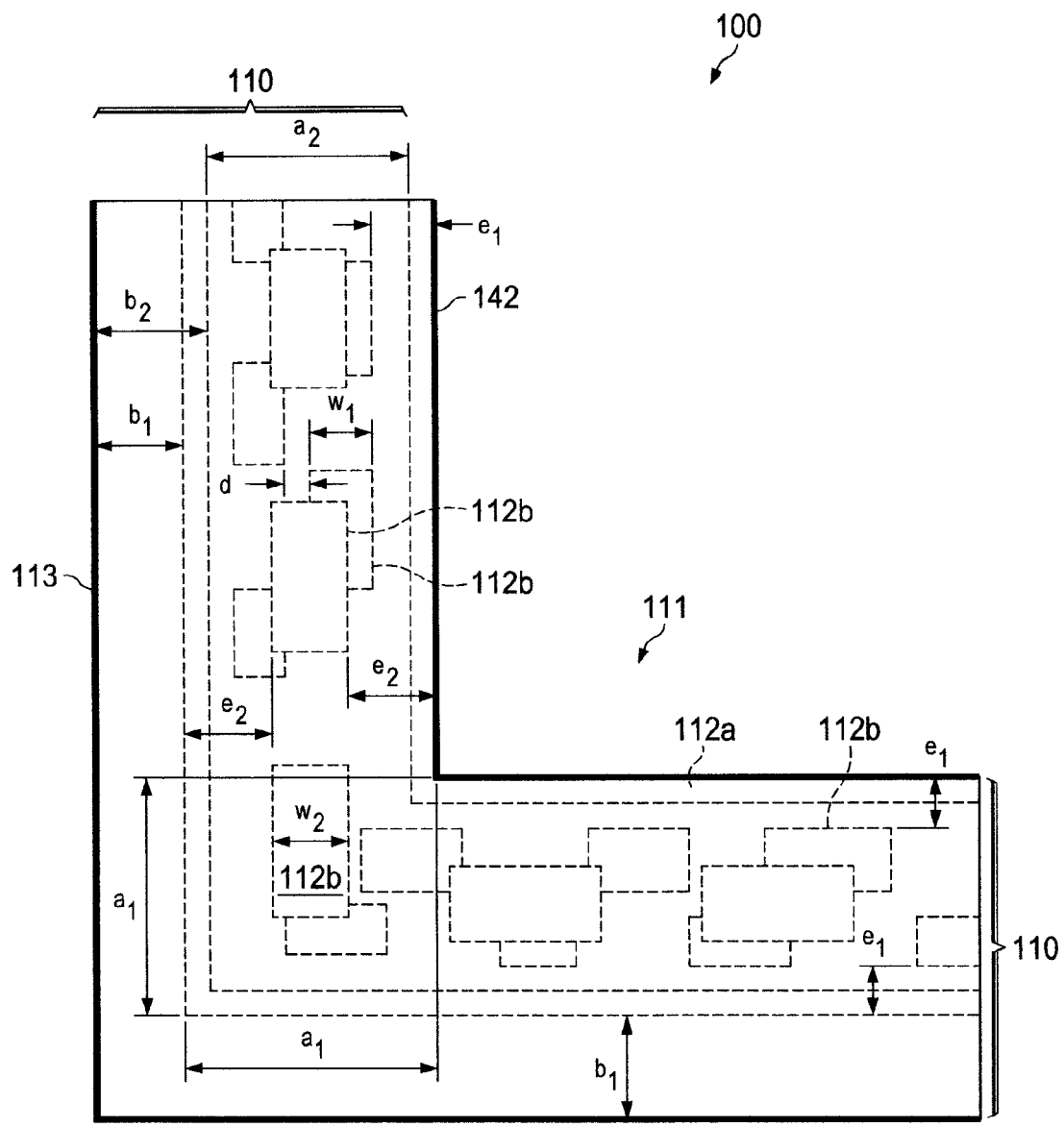
FIG. 6 is a top view of the portion of the packaged semiconductor device shown in FIG. 5 in accordance with some embodiments.

FIG. 4 is a top view of the portion of the packaged semiconductor device 100 shown in FIG. 3 in accordance with some embodiments. The protection pattern 111 extends fully along the package edge 142 to provide protection for the packaged semiconductor device 100 during a dicing process and other processes. The conductive features 112b of the protection pattern 111 formed in a via 130 layer of the interconnect structure 120 comprise continuous via bars in the embodiments shown. The conductive features 112b may also comprise non-continuous via bars, as shown in FIG. 6, or the conductive features 112b may comprise a plurality of square, rectangular, circular, or other shaped conductive features 112b (not shown), in some embodiments.

Figure 5:
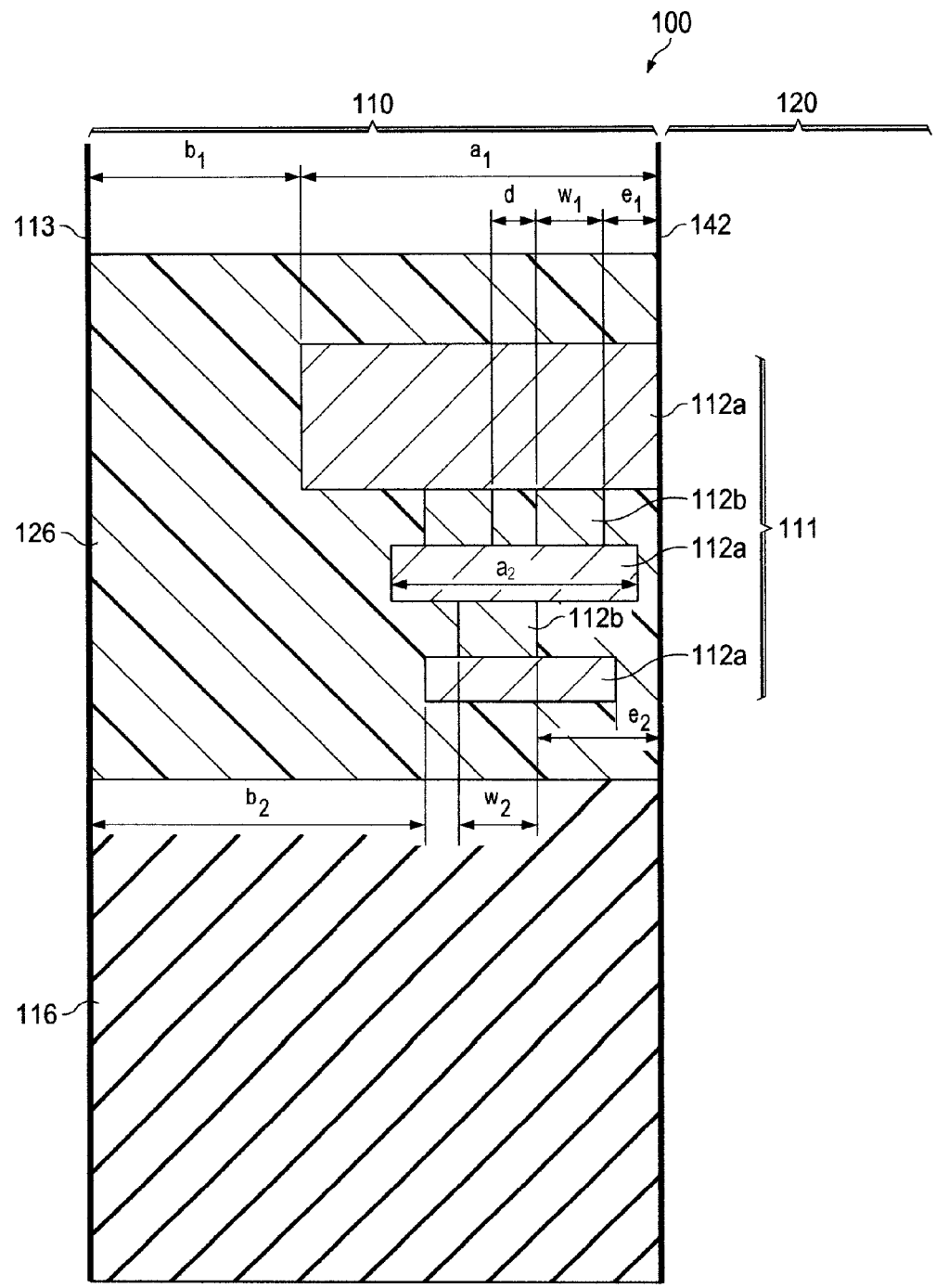
FIG. 5 is a cross-sectional view of a portion of a packaged semiconductor device in accordance with some embodiments of the present disclosure, wherein a protection pattern is formed in conductive feature layers of an interconnect structure in a perimeter region of the package.

In the embodiments shown in FIGS. 3 and 4, conductive features 112a formed in conductive line 128 layers of the interconnect structure 120 comprise substantially the same width. For example, a plurality of the conductive features 112a of the protection pattern 111 is disposed in a plurality of conductive line 128 layers of the interconnect structure 120, and two of the plurality of conductive features 112a disposed in two different ones of the plurality of conductive line 128 layers comprise substantially the same width. In other embodiments, two of the plurality of conductive features 112a disposed in two different ones of the plurality of conductive line 128 layers comprise different widths, as shown in FIG. 5, which is a cross-sectional view of a portion of a packaged semiconductor device 100 in accordance with some embodiments of the present disclosure. The protection pattern 111 is formed in conductive line 128 layers of an interconnect structure 120 in a perimeter region 110 of the package, as described in the embodiments shown in FIGS. 3 and 4. However, the conductive features 112a comprise different widths in the various conductive line 128 layers.

For example, dimension $a_1$ comprises a width of an uppermost conductive feature 112a, and dimension $a_2$ comprises a width of a lower conductive feature 112a in FIG. 5.

Dimension $a_1$ and $a_2$ comprise similar dimensions as described for dimension a herein. Dimension $a_1$ is different, e.g., larger than, dimension $a_2$ in the example shown. Dimension $a_1$ being different than dimension $a_2$ results in dimensions $b_1$ and dimension $b_2$ being different. Dimension $b_1$ and $b_2$ comprise similar dimensions as described for dimension b herein.

Likewise, the conductive features 112b may comprise different widths in the various via 130 layers in the interconnect structure 120, also illustrated in FIG. 5. For example, dimension $w_1$ comprises a width of an uppermost conductive feature 112b, and dimension $w_2$ comprises a width of a lowermost conductive feature 112b in FIG. 5. Dimension $w_1$ and $w_2$ comprise similar dimensions as described for dimension w herein. Dimension $w_1$ is different, e.g., less than, dimension $w_2$ in the example shown.

In embodiments of the present disclosure wherein a plurality of conductive features 112b of the protection pattern 111 is disposed in a plurality of via 130 layers of the interconnect structure 120, two of the plurality of conductive features 112b disposed in two different ones of the plurality of via 130 layers may be substantially aligned, as shown in FIG. 3. The uppermost conductive features 112b are aligned with the lowermost conductive features 112b, for example. In other embodiments, two of the plurality of conductive features 112b disposed in two different ones of the plurality of via 130 layers may not be aligned, as shown in FIG. 5. For example, the uppermost conductive features 112b are not aligned with the lowermost conductive features 112b in FIG. 5.

The various widths and non-alignment of the conductive features 112a and 112b results in dimensions $e_1$ and $e_2$ being different, also illustrated in FIG. 5. Dimension $e_1$ and $e_2$ comprise similar dimensions as described for dimension e herein. FIG. 6 is a top view of the portion of the packaged semiconductor device 100 shown in FIG. 5 in accordance with some embodiments. The various dimensions described herein for the protection pattern 111 in FIG. 5 are illustrated in the top view. Conductive features 112b comprising non-continuous via bar segments formed in the same material layers as vias 130 in a via 130 layer of the interconnect structure 120 in accordance with some embodiments are also illustrated in FIG. 6.

Figure 7:
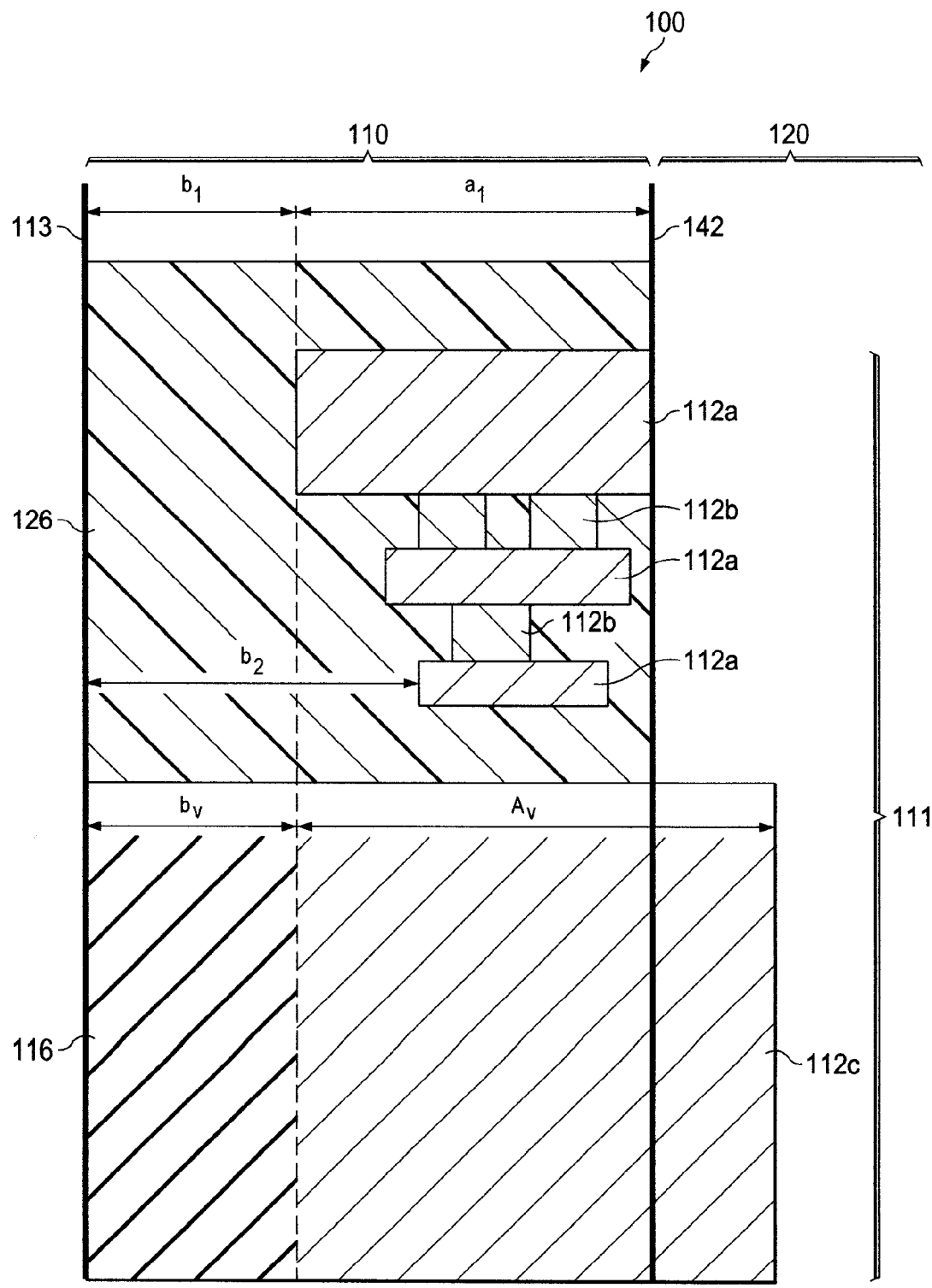
FIG. 7 is a cross-sectional view of a portion of a packaged semiconductor device in accordance with some embodiments of the present disclosure, wherein a portion of the protection pattern is formed in a through-via layer of the package.
Figure 8:
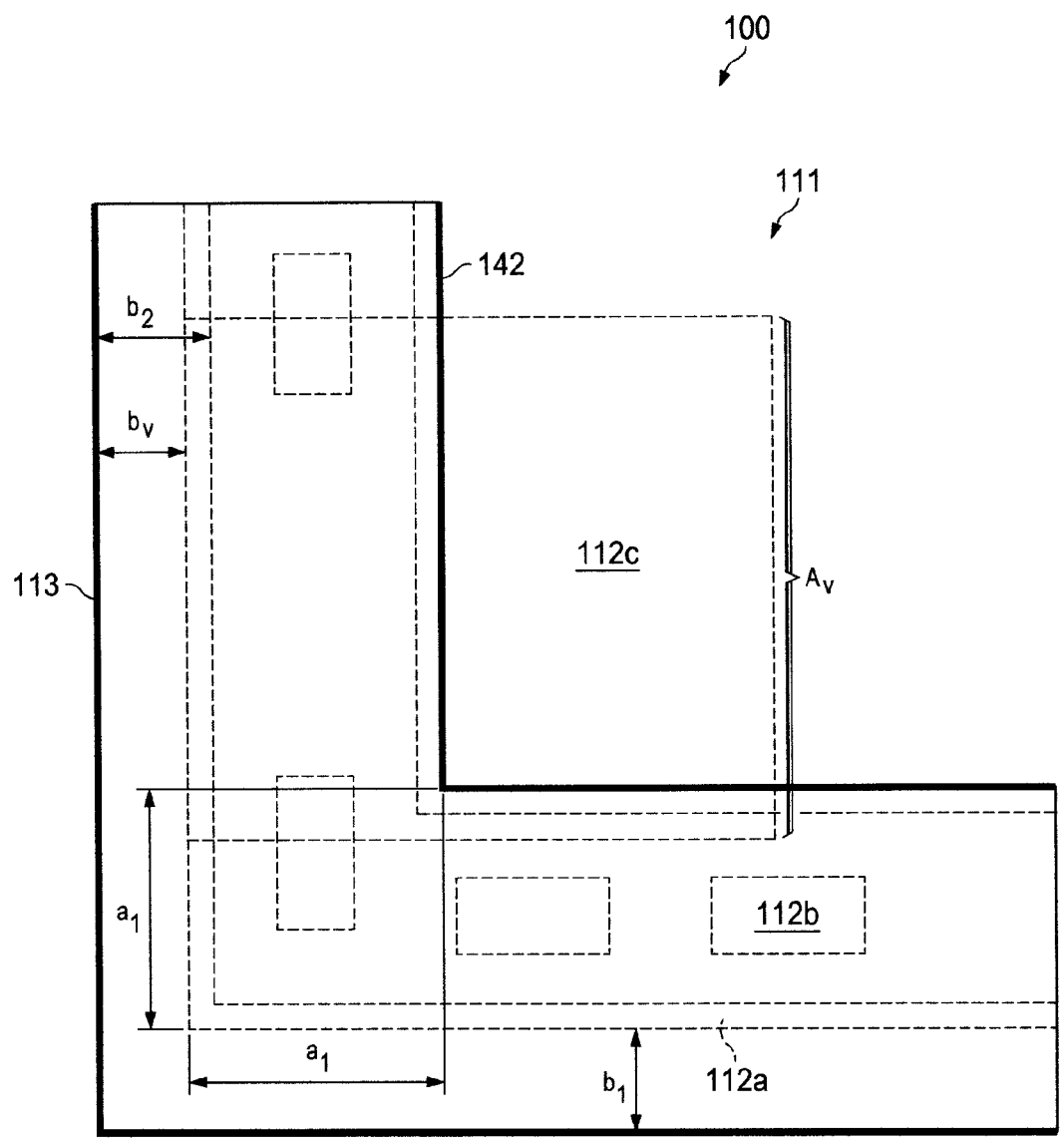
FIG. 8 is a top view of the portion of the packaged semiconductor device shown in FIG. 7 in accordance with some embodiments.

FIG. 7 is a cross-sectional view of a portion of a packaged semiconductor device 100 in accordance with some embodiments of the present disclosure, wherein a portion of the protection pattern 111 is formed in a through-via layer of the package. FIG. 8 is a top view of the portion of the packaged semiconductor device 100 shown in FIG. 7 in accordance with some embodiments. The portion of the protection pattern 111 may comprise substantially the same size as through-vias 106 formed in other regions of the package, below the interconnect structure 120.

For example, a plurality of through-vias 106 (see FIG. 1) may be disposed within the molding material 116, and a portion of the protection pattern 111 may include a conductive feature 112c disposed within the molding material 116, as shown in FIGS. 7 and 8. Each of the plurality of through-vias 106 may comprise a first size, and the conductive feature 112c disposed within the molding material 116 may comprise a second size, the second size being substantially the same as the first size.

Only one conductive feature 112c disposed in the molding material 116 is shown in FIG. 7; however, the protection pattern 111 may include a plurality of conductive features 112c disposed in the molding material 116. The conductive feature 112c of the protection pattern 111 comprises a size or width comprising dimension $A_v$, wherein dimension $A_v$ comprises about 100 µm or greater in some embodiments. The conductive feature 112c is spaced apart from the dicing path 113 by an amount comprising dimension $b_v$, wherein dimension $b_v$ comprises about 5 µm to about 10 µm in some embodiments. Dimensions $A_v$ and $b_v$ may also comprise other values.

In the embodiments shown in FIGS. 7 and 8, a portion of the conductive feature 112c may extend past the package edge 142 of the packaged semiconductor device into a region disposed beneath the interconnect structure 120. In other embodiments, a portion of the conductive feature 112c may not extend past the package edge 142 of the packaged semiconductor device into a region disposed beneath the interconnect structure 120, not shown.

Figure 9:
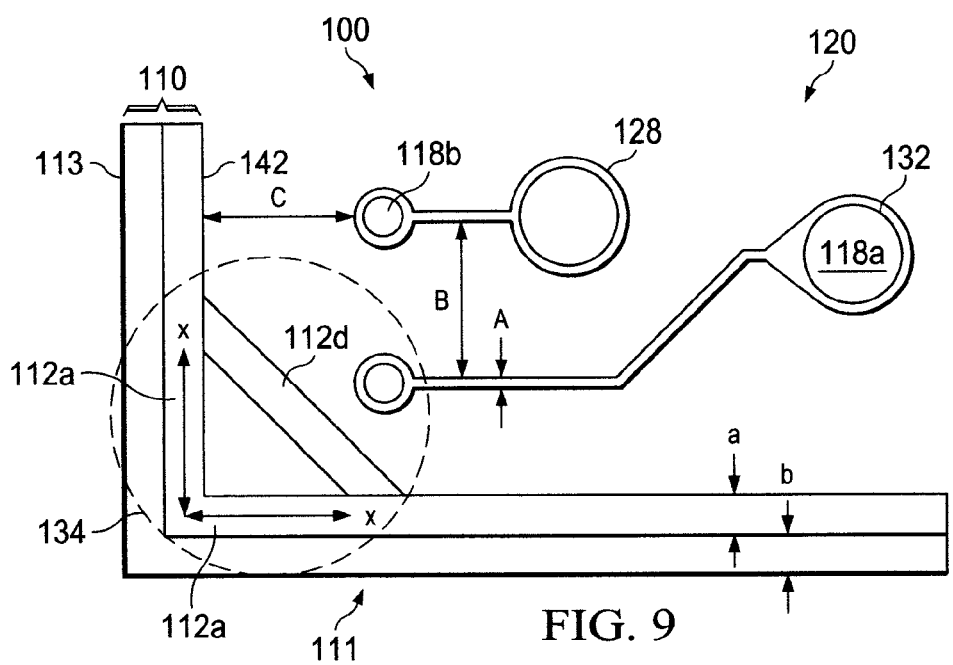
FIG. 9 is a top view of a portion of a packaged semiconductor device, illustrating a portion of a protection pattern formed in a corner region of the package in accordance with some embodiments.

FIG. 9 is a top view of a portion of a packaged semiconductor device 100, illustrating a portion of a protection pattern 111 formed in a corner region 134 of the package in accordance with some embodiments. The corner regions 134 of the package are reinforced with additional conductive material in empty areas of the interconnect structure 120 (e.g., in regions of the interconnect structure 120 containing no conductive features) in some embodiments. For example, in FIG. 9, conductive features 112a each comprise a first conductive member. The two first conductive members 112a are coupled together in the corner region 134. The two first conductive members 112a are coupled together substantially at a right angle. Thus, the two first conductive members 112a are substantially perpendicular to one another, in some embodiments.

The protection pattern 111 further includes a second conductive member 112d disposed between the two first conductive members 112a in the corner region 134 of the package. The two first conductive members 112a and the second conductive member 112d comprise a substantially triangular shape in the top view.

A length of the two first conductive members 112a comprises a dimension x in some embodiments. Dimension x comprises [2*(a minimal value of dimension C)] in some embodiments. Dimension x comprises about 40 µm in some embodiments, for example. Dimension x comprises about 40 µm in embodiments wherein a minimal value of dimension C comprises about 20 µm, for example. Dimension x may also comprise other values.

A portion of the conductive features of the protection pattern 111 (e.g., second conductive member 112d) extends past a package edge 142 of the package into a region disposed beneath or proximate the interconnect structure 120 in some of the embodiments shown in FIG. 9 through 13, for example.

FIGS. 10, 11, 12, and 13 are top views of a corner region 134 of a packaged semiconductor device 100 that illustrate some exemplary shapes and arrangements of protection patterns 111 in accordance with some embodiments. A plurality of third conductive members 112e, 112f, and/or 112g are coupled between the second conductive feature 112d and one of the two first conductive members 112a or 112a', or between both the second conductive member 112d and the two first conductive members 112a and 112a'.

Figure 10:
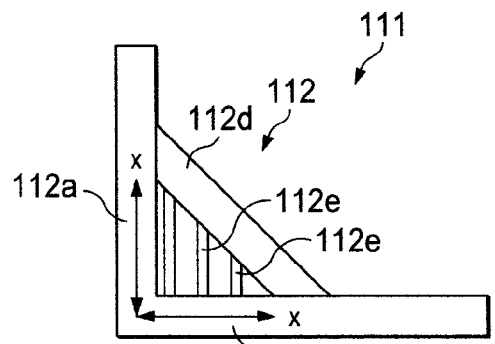
FIGS. 10, 11, 12, and 13 are top views of a corner region of a packaged semiconductor device that illustrate some exemplary shapes and arrangements of protection patterns in accordance with some embodiments.

For example, in the embodiments shown in FIG. 10, the protection pattern 111 in the corner region includes a plurality of third conductive members 112e that are coupled between the second conductive member 112d and first conductive member 112a'. The third conductive members 112e are oriented in a vertical direction in the view shown. In the embodiments shown in FIG. 11, a plurality of third conductive members 112f are coupled between the second conductive member 112d and first conductive member 112a. The third conductive members 112f are oriented in a horizontal direction.

Figure 11:
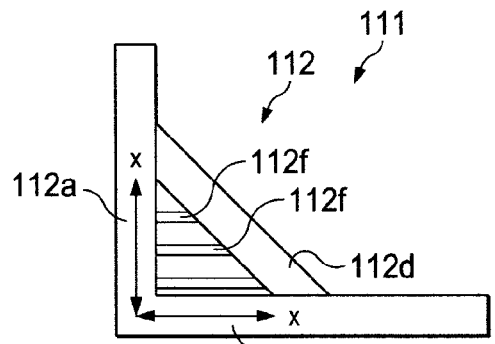
Figure 12:
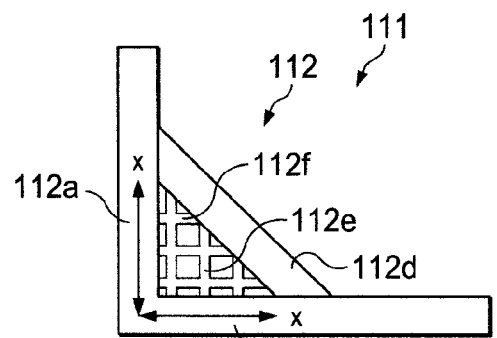

In the embodiments shown in FIG. 12, the structures shown in FIGS. 10 and 11 are combined. The protection pattern 111 in the corner region 134 includes a plurality of third conductive members 112e oriented in a vertical direction that are coupled between the second conductive member 112d and first conductive member 112a', and a plurality of third conductive members 112f oriented in a horizontal direction that are coupled between the second conductive member 112d and first conductive member 112a. The third conductive members 112e and 112f form a grid shaped arrangement of conductive features disposed between the second conductive member 112d and the first conductive members 112a and 112a'.

Figure 13:
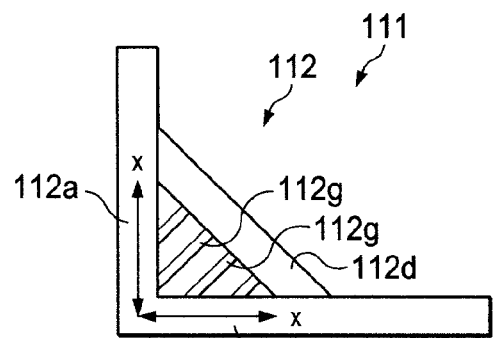

In FIG. 13, the protection pattern 111 in the corner region 134 comprises a plurality of third conductive members 112g that are coupled between the second conductive member 112d and both of the first conductive members 112a and 112a'. The third conductive members 112g extend in parallel from the second conductive member 112d at an angle towards both of the first conductive members 112a and 112a'.

The structures shown in corner regions 134 of the packages shown in FIGS. 9 through 13 are merely examples. The arrangement of the fortified and reinforced protection patterns 111 in corner regions 134 of the packaged semiconductor device 100 may also comprise other shapes, configurations, and arrangements. Additional conductive members comprising different shapes and patterns may also be used.

Figure 14:
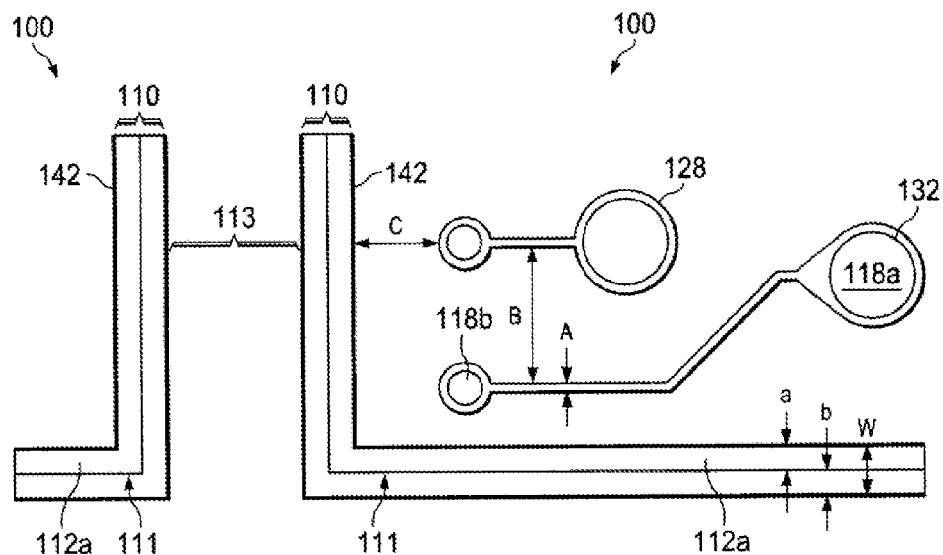
FIG. 14 is a top view illustrating a dicing path disposed between two adjacent packaged semiconductor devices that include protection patterns in accordance with some embodiments.

FIG. 14 is a top view illustrating a dicing path 113 that is disposed between two adjacent packaged semiconductor devices 100 that include protection patterns 111 in perimeter regions 110 in accordance with some embodiments. The novel protection patterns 111 provide a control structure for the dicing path 113, limiting dicing between the protection patterns 111 and also providing alignment for the dicing process and other processes of the packaged semiconductor devices 100.

FIG. 15 is a cross-sectional view of a packaged semiconductor device 170 in accordance with some embodiments, wherein a packaged semiconductor device 100 described herein is coupled to another packaged semiconductor device 150. The packaged semiconductor device 170 comprises a first packaged semiconductor device 100 in some embodiments, and the first packaged semiconductor device 100 is coupled to a second packaged semiconductor device 150 by a plurality of connectors 158. The connectors 158 which may comprise solder balls or other materials are coupled between contact pads of the first packaged semiconductor device 100 and contact pads of the second packaged semiconductor device 150, for example. Some contact pads are coupled to the integrated circuit die 102 and some of the contact pads are coupled to the through-vias 106, in some embodiments. In some embodiments, the packaged semiconductor device 170 comprises a package-on-package (PoP) device, for example.

The interconnect structure 120 comprises a first interconnect structure 120a in some embodiments. A second interconnect structure 120b is formed on an opposite side of the package than the side the first interconnect structure 120a is formed on, in some embodiments. The first interconnect structure 120a comprises a front side RDL, and the second interconnect structure 120b comprises a back side RDL, in some embodiments.

The packaged semiconductor device 100 includes a plurality of the through-vias 106 formed within the molding material 116. The through-vias 106 provide vertical connections for the packaged semiconductor device 100. The interconnect structures 120a and 120b provide horizontal electrical connections for the packaged semiconductor device 100. Packaged semiconductor device 150 also includes an interconnect structure 120c that provides horizontal electrical connections for the packaged semiconductor device 150. Interconnect structure 120c is coupled to interconnect structure 120b by a plurality of the connectors 158.

The second packaged semiconductor device 150 includes one or more integrated circuit dies 156 coupled to a substrate 154. In some embodiments, the dies 156 comprise memory chips. For example, the dies 156 may comprise dynamic random access memory (DRAM) devices in some embodiments. The dies 156 may also comprise other types of chips. Wire bonds 152 may be coupled to contact pads on a top surface of the integrated circuit die or dies 156, which are coupled to bond pads on the substrate 154. The wire bonds 152 provide vertical electrical connections for the packaged semiconductor device 150 in some embodiments, for example. A molding material 148 may be disposed over the wire bonds 152, the integrated circuit die or dies 156, and the substrate 154.

A PoP device 170 may also include two packaged semiconductor devices 100 described herein that are coupled together in some embodiments, not shown in the drawings. In some embodiments, the PoP device 170 may comprise a system-on-a-chip (SOC) device, as another example. The PoP device 170 may also be coupled to a substrate 172, shown in phantom, by connectors 122 of the first packaged semiconductor device 100 to form an integrated fan-out (InFO) device 174.

In some embodiments, an insulating material 160 is disposed between the packaged semiconductor devices 100 and 150 between the connectors 158, as shown in phantom in FIG. 15. The insulating material 160 may comprise an underfill material or a molding material, as examples. The insulating material 160 may also comprise other materials, or the insulating material 160 may not be included.

Figure 16:
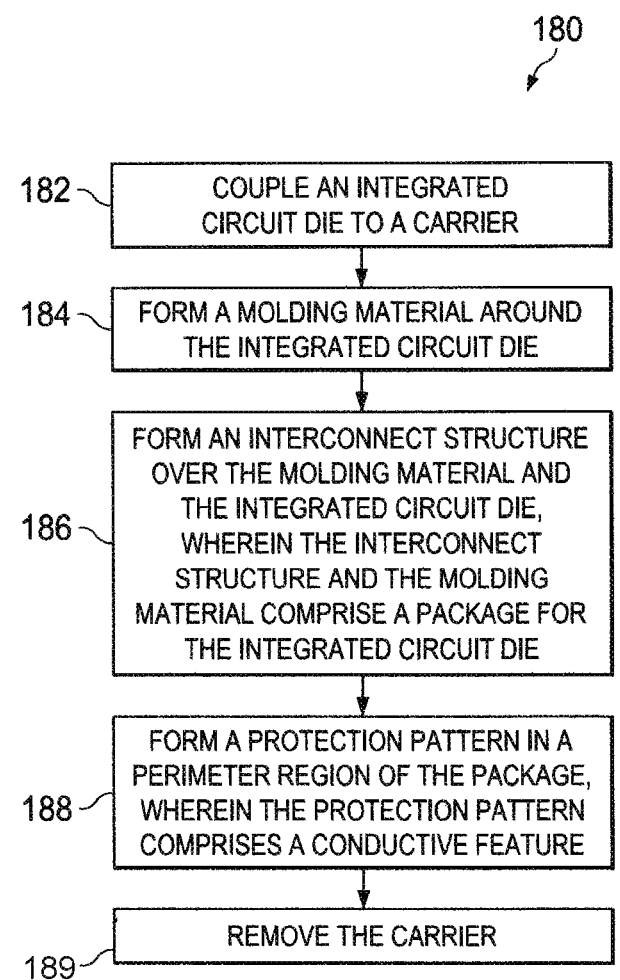
FIG. 16 is a flow chart of a method of packaging a semiconductor device in accordance with some embodiments.

FIG. 16 is a flow chart 180 that illustrates of a method of packaging a semiconductor device in accordance with some embodiments. The method shown in FIG. 16 is an example; however, other methods may also be used that include the novel protection patterns 111 described herein. The flow chart 180 will next be described. FIG. 1 may also be referred to view the elements of the packaged semiconductor device 100.

First, a carrier 101 shown in phantom in FIG. 1 is provided. The carrier 101 may comprises a first carrier in some embodiments. The carrier 101 may comprise glass, silicon oxide, aluminum oxide, or a semiconductor wafer, as examples. The carrier 101 may also comprise other materials.

An integrated circuit die 102 is also provided. The integrated circuit die 102 may be previously fabricated on a semiconductor wafer and singulated along scribe lines to form individual integrated circuit dies 102, for example. The integrated circuit die 102 may comprise a logic chip, a memory chip, a processor, an application specific device, or a chip having other functions, as examples. Only one integrated circuit die 102 is shown in the drawings; however, a plurality of integrated circuit dies 102 may be packaged over the carrier 101 simultaneously, and the packaged devices are later singulated to form individually packaged dies 102 or a plurality of dies 102 packaged together in a single package.

In step 182 of the flow chart 180 shown in FIG. 16, the integrated circuit die 102 is coupled to the carrier 101 manually or using an automated machine such as a pick-and-place machine. The integrated circuit die 102 is coupled to the carrier 101 in the integrated circuit die mounting region 104 as shown in FIG. 1 using an adhesive or a die attach film (DAF), not shown. In some embodiments, one integrated circuit die 102 is coupled to the carrier 101 and is packaged using the techniques described herein. In other embodiments, two or more integrated circuit dies 102 may be coupled to the carrier 101 and packaged together in a single packaged semiconductor device 100 (not shown in the drawings). A plurality of integrated circuit dies 102 comprising the same or different functions may be packaged together in accordance with some embodiments, for example. One or more types of integrated circuit dies 102 may be packaged in a single packaged semiconductor device 100 to form a system on a chip (SoC) device in some embodiments, for example.

In step 184, a molding material 116 is formed over the carrier 101 over the integrated circuit die 102. As applied, the molding material 116 may extend over a top surface of the die 102. The molding material 116 is formed around the integrated circuit die 102. The molding material 116 may be molded using compressive molding, transfer molding, or other methods. The molding material 116 encapsulates the integrated circuit dies 102, for example. The molding material 116 may comprise an epoxy, an organic polymer, or a polymer with or without a silica-based or glass filler added, as examples. In some embodiments, the molding material 116 comprises a liquid molding compound (LMC) that is a gel type liquid when applied. The molding material 116 may also comprise other insulating and/or encapsulating materials, or other materials.

In some embodiments, the molding material 116 is applied so that it extends to top surfaces of the integrated circuit dies 102. The top surface of the material 116 is substantially coplanar with top surfaces of the integrated circuit dies 102 in some embodiments, for example. If the molding material 116 extends over top surfaces of the integrated circuit dies 102 after the material 116 is applied, the molding material 116 is removed from over the top surfaces of the integrated circuit dies 102 using a chemical-mechanical polish (CMP) process, an etch process, other methods, or combinations thereof, in some embodiments. The molding material 116 is left remaining around the integrated circuit dies 102.

Next, the molding material 116 is cured using a curing process in some embodiments. The curing process may comprise heating the molding material 116 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. The molding material 116 may also be cured using other methods. In some embodiments, a curing process is not required for the molding material 116.

In step 186, an interconnect structure 120 is formed over the integrated circuit die 102 and the material 116. The interconnect structure 120 is formed over a first side of the integrated circuit die 102 and the material 116 in some embodiments. The first side comprises a front side of the packaged semiconductor device 100 in some embodiments, for example. The interconnect structure 120a comprises one or more insulating material layers 126 and conductive features 128 and 130 formed in the insulating material layers 126. The interconnect structure 120 may be formed using one or more subtractive etch processes, single damascene processes, dual damascene processes, plating processes, or other types of processes. The interconnect structure 120 comprises a first interconnect structure 120a in some embodiments (see FIG. 15).

The interconnect structure 120 and the molding material 116 comprise a package for the integrated circuit die 102 in some embodiments, as described in step 186.

In step 188, a protection pattern 111 is formed in a perimeter region 110 of the package, as shown in FIG. 1. The protection pattern 111 comprises a conductive feature 112. Step 188 is performed simultaneously with step 186 in some embodiments. The interconnect structure 120 and the protection pattern 111 are simultaneously formed in some embodiments, for example. The protection patterns 111 are formed in the perimeter region 110 during the fabrication of the interconnect structure 120, for example. The protection patterns 111 are formed in material layers of the interconnect structures 120, as described previously herein.

In some embodiments, after the interconnect structure 120 is formed, the carrier 101 is removed (step 189), and the packaging process for the packaged semiconductor device 100 is complete. A plurality of the packaged semiconductor devices 100 are then singulated using a saw blade or laser along the dicing paths 113. The protection patterns 111 protect the packaged semiconductor devices 100 during the dicing process and prevent or reduce chipping of material layers of the interconnect structure 120, advantageously.

In other embodiments, a plurality of connectors 122 is formed on the interconnect structure 120, also shown in FIG. 1 in phantom. The connectors 122 are formed on UBM structures 132 of the interconnect structure 120, for example. The connectors 122 comprise a eutectic material such as solder, and may comprise solder balls or solder paste in some embodiments. The connectors 122 may include other types of electrical connectors, such as microbumps, controlled collapse chip connection (C4) bumps, or pillars, and may include conductive materials such as Cu, Sn, Ag, Pb, or the like.

In some embodiments, after the connectors 122 are formed, the carrier 101 is removed, and the packaging process for the packaged semiconductor device 100 is complete. A plurality of the packaged semiconductor devices 100 are then singulated using a saw blade or laser along the dicing paths 113.

In other embodiments, a second carrier (not shown) is coupled to the connectors 122 and to the interconnect structure 120, after forming the connectors 122. The second carrier may be coupled to the connectors 122 and/or to the interconnect structure 120 using a temporary adhesive, for example. The first carrier 101 is then removed.

In some embodiments, a second interconnect structure 120b (see FIG. 15) is then formed on a second side of the integrated circuit die 102 and the molding material 116, the second side being opposite the first side. The second side comprises a back side of the packaged semiconductor device 100 in some embodiments, for example. The second interconnect structure 120b comprises similar materials and features as described for the first interconnect structure 120a, for example.

A plurality of connectors 158 is coupled to the second side of the packaged semiconductor device 100 in some embodiments (see FIG. 15). The connectors 158 are coupled to portions of the second interconnect structure 120b in some embodiments, such as contact pads (not shown), for example. The connectors 158 comprise similar materials and formation methods as described for connectors 122 in some embodiments, for example. The second carrier 101b and adhesive are then removed or debonded from a plurality of the packaged semiconductor devices 100, and the packaged semiconductor devices 100 are then singulated using a saw blade or laser along the dicing paths 113.

The packaged semiconductor devices 100 may then be electrically and mechanically coupled to another packaged semiconductor device, to a printed circuit board (PCB), or in an end application or to another object using the connectors 122 and/or 158.

In some embodiments, a method of packaging a semiconductor device includes forming an interconnect structure 120 wherein the interconnect structure 120 comprises a redistribution layer (RDL) or a post-passivation interconnect (PPI) structure.

In some embodiments, a method of packaging a semiconductor device includes forming a plurality of integrated circuit 102 dies to a carrier 101, and forming the molding material 116 around each of the plurality of integrated circuit dies 102. An interconnect structure 120 is formed over each of the plurality of integrated circuit dies 102. A protection pattern 111 is formed in a perimeter region 110 of each of the plurality of integrated circuit dies 102. The plurality of packaged integrated circuit dies 102 are separated along a dicing path 113 proximate the protection patterns 111.

In other embodiments, a method of packaging a semiconductor device further includes aligning the package using the protection pattern 111.

In the embodiments shown in FIGS. 5 and 7, the conductive features 112a of the protection pattern 111 comprise different widths within the various conductive line 128 layers. For example, conductive features 112a that are most proximate or closest to the molding material 116 have a smaller width than other conductive features 112a of the protection pattern 111. Conductive features 112a that are most proximate or closest to the top surface of the packaged semiconductor devices 100 have a larger width than other conductive features 112a of the protection pattern 111. The shape of the protection patterns 111 comprises an inverted pyramid shape or triangular shape in a cross-sectional view in some of the embodiments shown in FIGS. 5 and 7, for example. The widths of the conductive features 112a are tiered, with each conductive feature 112a decreasing successively in the size of the width from a top surface of the packaged semiconductor device 100 towards the molding material 116.

In accordance with some of the embodiments illustrated in FIGS. 17 through 23, the conductive features 112a of the protection patterns also comprise different widths. Conductive features 112a that are most proximate or closest to the molding material 116 have a larger width than other conductive features 112a of the protection pattern 111. Conductive features 112a that are most proximate or closest to the top surface of the packaged semiconductor devices 100 have a smaller width than other conductive features 112a of the protection pattern 111. The overall shape of the protection patterns 111 comprises an upright pyramid shape or triangular shape in a cross-sectional view in some of these embodiments, for example, extending away from the molding material 116. The widths of the conductive features 112a are tiered, with each conductive feature 112a increasing successively in the size of the width from a top of the packaged semiconductor device 100 towards the molding material 116. The tiered shape of the widths of the conductive features 112a is advantageous in some embodiments and applications for reducing or eliminating delamination and cracking of the materials of the packaged semiconductor devices 100 during a dicing process, for example.

Figure 17:
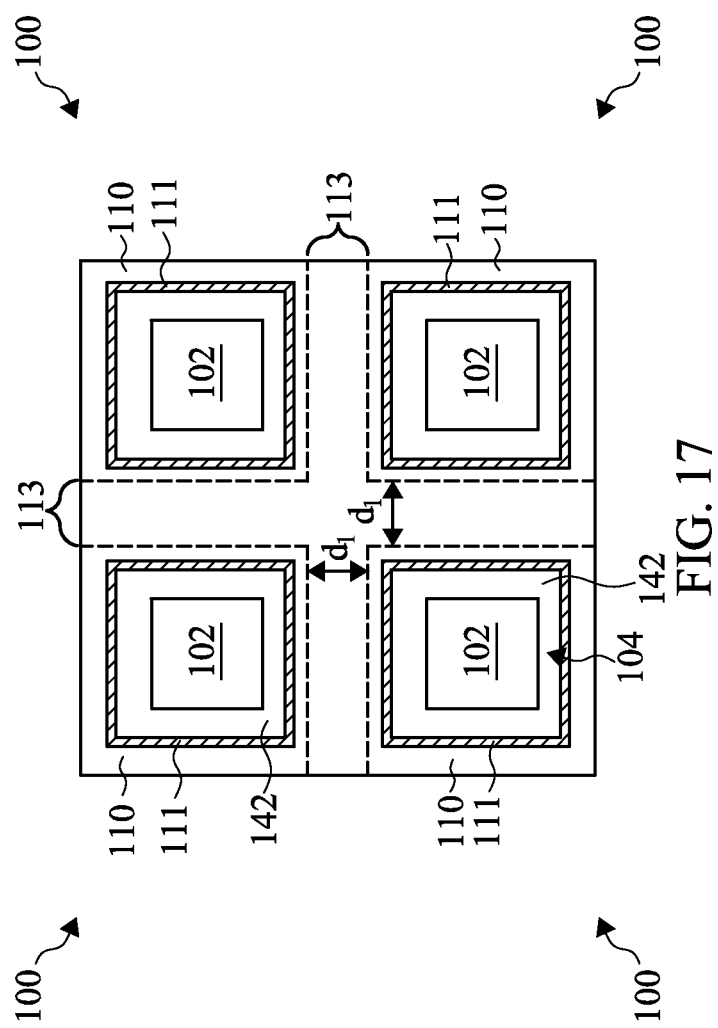
FIG. 17 is a top view that illustrates a plurality of packaged semiconductor devices that include a protection pattern in accordance with some embodiments.

FIG. 17 is a top view that illustrates a plurality of packaged semiconductor devices 100 that include protection patterns 111 in perimeter regions 110 in accordance with some embodiments. Four integrated circuit dies 102 are illustrated that have been simultaneously packaged. Other numbers of integrated circuit dies 102 may also be simultaneously packaged, such as 1, 2, 3, or 5 or more integrated circuit dies 102, as examples, not shown. The protection patterns 111 are formed in the perimeter regions 110 of the packages, between the package edges 142 and the dicing paths 113 which are disposed between adjacent packaged semiconductor devices 100. The protection patterns 111 are formed in interconnect structures 120 (see FIG. 18) and are disposed around the interconnect structures 120 and the integrated circuit dies 102. The dicing paths 113 comprise a width comprising dimension $d_1$, wherein dimension $d_1$ may comprise about 200 µm to about 250 µm, or about 220 µm, in some embodiments. Dimension d1 may also comprise other values in some embodiments.

Figure 18:
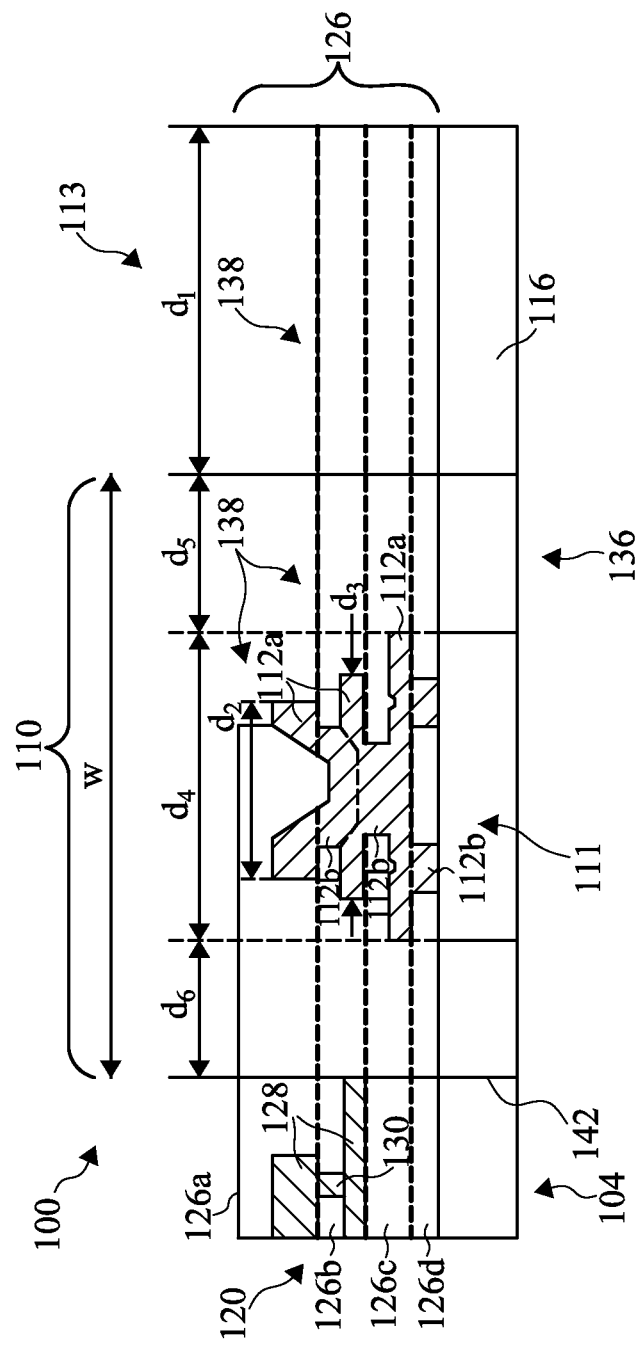
FIG. 18 is a cross-sectional view of a portion of a packaged semiconductor device shown in FIG. 17 in accordance with some embodiments.

FIG. 18 is a cross-sectional view of a portion of a packaged semiconductor device 100 shown in FIG. 17 in accordance with some embodiments. The protection pattern 111 comprises a tiered shape, with a narrower conductive feature 112a at the top, a wider conductive feature 112a at the middle, and an even wider conductive feature 112a at the bottom, closest to the molding material 116. A protection pattern 111 comprising three conductive features 112a is illustrated in the drawings. The protection patterns 111 may also comprise two conductive features 112a that are stacked within insulating materials 126, or four or more stacked conductive features 112a. The protection pattern 111 may be formed in some or all of the material layers of the interconnect structure 120.

A portion of the protection pattern 111 may also be formed in the molding material 116 in the same material layer that through-vias 106 are formed in, as previously described herein with reference to FIG. 7. Likewise, the protection pattern 111 may include additional conductive material for reinforcement in the corners of the package, as previously described herein with reference to FIGS. 9 through 13.

Figure 23:
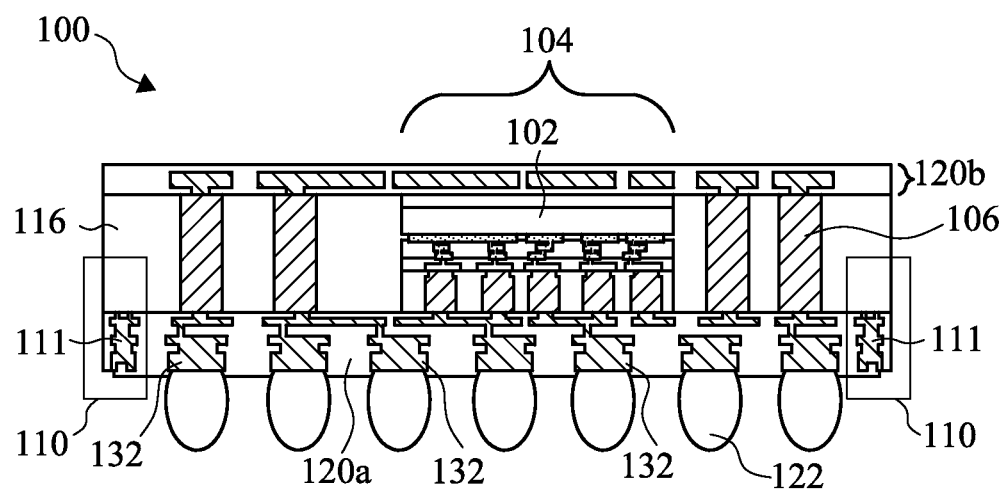
FIG. 23 shows a cross-sectional view of a packaged semiconductor device that includes a protection pattern in accordance with some embodiments.

Four insulating material layers 126a, 126b, 126c, and 126d of the insulating materials 126 previously described herein are illustrated in FIG. 18. The lower insulating material layer 126d is disposed over the molding material 116, the through-vias 106 (not shown in FIG. 18; see FIG. 23), and the integrated circuit die 102 (FIG. 23). The lower insulating material layer 126d may comprise a thickness of about 2 µm to about 7 µm, or about 4.5 µm in some embodiments. Insulating material layer 126c is disposed over insulating material layer 126d and may comprise a thickness of about 7 µm to about 11 µm, or about 9 µm in some embodiments. Insulating material layer 126b is disposed over insulating material layer 126c and may comprise a thickness of about 5 µm to about 9 µm, or about 7 µm in some embodiments. The upper insulating material layer 126a is disposed over insulating material layer 126b and may comprise a thickness of about 8 µm to about 12 µm, or about 10 µm in some embodiments. The insulating material layers 126a, 126b, 126c, and 126d of the insulating materials 126 may also comprise other dimensions, in some embodiments. Insulating materials 126 may comprise less than four, or five or more insulating material layers in other embodiments.

In some of the embodiments shown in FIG. 18, a conductive feature 112a of the protection pattern 111 is disposed in an uppermost insulating material layer 126a of insulating material 126, wherein the conductive feature 112a comprises a width comprising dimension $d_2$. Dimension $d_2$ may comprise about 34 µm to about 38 µm, or about 36 µm in some embodiments. A conductive feature 112a of the protection pattern 111 is also disposed in insulating material layer 126b of insulating material 126, wherein the conductive feature 112a comprises a width comprising dimension $d_3$. Dimension $d_3$ may comprise about 42 µm to about 46 µm, or about 44 µm in some embodiments. A conductive feature 112a is also disposed in insulating material layer 126c of insulating material 126, wherein the conductive feature 112a comprises a width comprising dimension $d_4$. Dimension $d_4$ may comprise about 48 µm to about 52 µm, or about 50 µm in some embodiments. Dimensions $d_2$, $d_3$, and $d_4$ may also comprise other values. For example, in some embodiments, dimensions $d_2$, $d_3$, and $d_4$ may comprise about 25 µm to about 55 µm, or about 60 µm or less. In some embodiments, the widths of the conductive features 112a may comprise about 60 µm or less, as another example.

In accordance with some embodiments, a difference in widths of adjacent conductive features 112a that are stacked within insulating materials 126 may comprise about 1 µm to about 20 µm, or about 2 µm to about 15 µm, as examples. For example, a difference between dimensions $d_2$ and $d_3$ may comprise about 1 µm to about 20 µm, or about 2 µm to about 15 µm, and a difference between dimensions $d_3$ and $d_4$ may comprise about 1 µm to about 20 µm, or about 2 µm to about 15 µm, in some embodiments. In some embodiments, a width of a conductive feature 112a may be greater than a width of a proximate conductive feature 112a by about 1 µm to about 20 µm, for example. The differences between dimensions $d_2$ and $d_3$ and between dimensions $d_3$ and $d_4$ may also comprise other values.

In some embodiments, the values of dimensions $d_2$, $d_3$, and $d_4$ and the value of the differences between dimensions $d_2$ and $d_3$ and between dimensions $d_3$ and $d_4$ described herein are selected that are sufficient to provide protection against chipping and delamination of the various material layers of the packaged semiconductor device 100 during a subsequent dicing or singulation process, for example.

Conductive features 112a are connected to vertically overlying or underlying conductive features 112a by conductive features 112b in some embodiments. Conductive features 112a are formed in conductive line 128 layers of the interconnect structure 120, and conductive features 112b are formed in via 130 layers of the interconnect structure 120, as shown and described for the previous embodiments herein. For example, the top conductive feature 112a and a conductive line 128 are formed in a lower portion of insulating material layer 126a in FIG. 18. A conductive feature 112b is disposed beneath the top conductive feature 112a, and the conductive feature 112b and a via 130 are formed in an upper portion of insulating material layer 126b. Likewise, a conductive feature 112a and a conductive line 128 are formed in a lower portion of insulating material layer 126b. The conductive feature 112a in the lower portion of the insulating material layer 126b is coupled to the conductive feature 112b in the upper portion of insulating material layer 126b: thus, the conductive feature 112b in the via 130 layer couples together the conductive feature 112a in insulating material layer 126a and the conductive feature 112a in insulating material layer 126b. Similarly, a conductive feature 112b is formed in an upper portion of insulating material layer 126c, a conductive feature 112a is formed in a lower portion of insulating material layer 126c, and one or more conductive features 112b may be formed in insulating material layer 126d. In some embodiments, conductive features 112b may not be included or formed in the insulating material layer 126d, not shown.

Thus, the conductive features 112a and 112b of the protection pattern 111 comprise a stack of conductive material that extends along the perimeter region 110 of the package. In some embodiments, edges of the conductive features 112a and 112b are spaced apart from the dicing path 113 by an amount comprising dimension $d_5$, wherein dimension $d_5$ may comprise about 40 μm or less, or about 30 μm in some embodiments. Opposite edges of the conductive features 112a and 112b are spaced apart from the package edge 142 by an amount comprising dimension $d_6$, wherein dimension $d_6$ may comprise about 40 μm or less, or about 20 μm in some embodiments. Dimensions $d_5$ and $d_6$ may also comprise other values. The overall width W of the perimeter region 110 comprises a distance between the package edge 142 to the dicing path 113.

A keep-out zone 136 is disposed between the protection pattern 111 and the dicing path 113 in some embodiments, also shown in FIG. 18. The keep-out zone 136 comprises a region wherein no conductive features 112a or 112b of the protection pattern 111 are formed, for example. The keep-out zone 136 provides a buffer area or additional space within the perimeter region 110 that ensures that the protection pattern 111 does not become damaged during a dicing process, for example. The keep-out zone 136 may also avoid radio frequency (RF) noise interference for the package and reduce package stress. A width of the keep-out zone 136 may comprise dimension $d_5$.

In some embodiments, the protection pattern 111 comprises a seal ring, and the keep-out zone 136 is disposed between the seal ring and the dicing path 113, for example. The seal ring is continuous in some embodiments. In other embodiments, the seal ring may be non-continuous. For example, the protection pattern 111 may include conductive features 112b formed in via 130 layers that comprise continuous via bars, forming a continuous seal ring. The conductive features 112b formed in the via 130 layers may also comprise non-continuous via bars, as shown in FIG. 6, creating a non-continuous seal ring. The conductive features 112b formed in the via 130 layers may also comprise a plurality of square, rectangular, circular or other shaped features (not shown), forming a non-continuous seal ring.

In some embodiments, the keep-out zone 136 comprises a recess 138 in insulating materials 126. For example, the keep-out zone 136 comprises a recess 138 in the upper insulating material layer 126a in the embodiments shown in FIG. 18. A recess 138 may also be formed in the insulating materials 126 in the dicing path 113 and/or over a portion of the protection pattern 111, which is also shown in FIG. 18. The recesses 138 may be formed using lithography processes or other methods, for example. The recesses 138 may assist in preventing delamination penetration in some embodiments, for example. In some embodiments, a recess 138 is not included in the keep-out zone 136, the dicing path 113, and/or over a portion of the protection pattern 111.

In some embodiments, the conductive features 112a of the protection pattern 111 are disposed successively over one another with tiered widths, and the conductive features 112a are substantially aligned. In some embodiments, the stacked conductive features 112a are substantially concentric. For example, in some embodiments, a first conductive feature 112a is disposed over a second conductive feature 112a, and the first conductive feature 112a and the second conductive feature 112a having different widths are substantially concentric.

Figure 19:
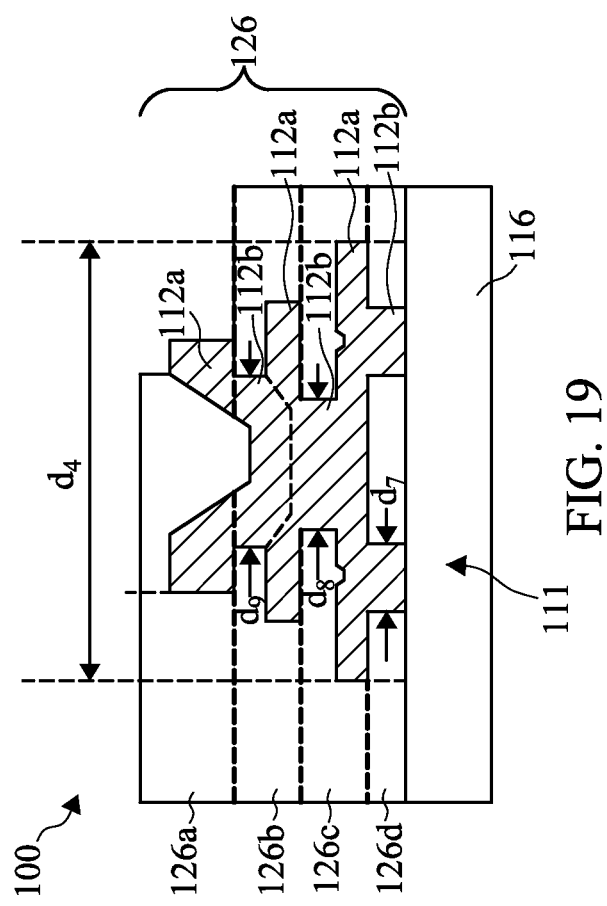
FIG. 19 is a more detailed cross-sectional view of the portion of the packaged semiconductor device shown in FIG. 18 in accordance with some embodiments.

FIG. 19 is a more detailed cross-sectional view of the portion of the packaged semiconductor device 100 shown in FIG. 18 in accordance with some embodiments. Some dimensions of widths of the conductive features 112b of the protection pattern 111 formed in via 130 layers of the interconnect structure 120 are illustrated. Dimension $d_7$ comprises a width of a lower conductive feature 112b formed in insulating material layer 126d, wherein dimension $d_7$ may comprise about 7 μm to about 9 μm, or about 8 μm, in some embodiments. Dimension $d_8$ comprises a width of a middle conductive feature 112b formed in insulating material layer 126c, wherein dimension $d_8$ may comprise about 13 μm to about 17 μm, or about 15 μm, in some embodiments. Dimension $d_9$ comprises a width of an upper conductive feature 112b formed in insulating material layer 126b, wherein dimension $d_9$ may comprise about 17 μm to about 23 μm, or about 20 μm, in some embodiments. Dimensions $d_7$, $d_8$, and $d_9$ may also comprise other values.

Figure 20:
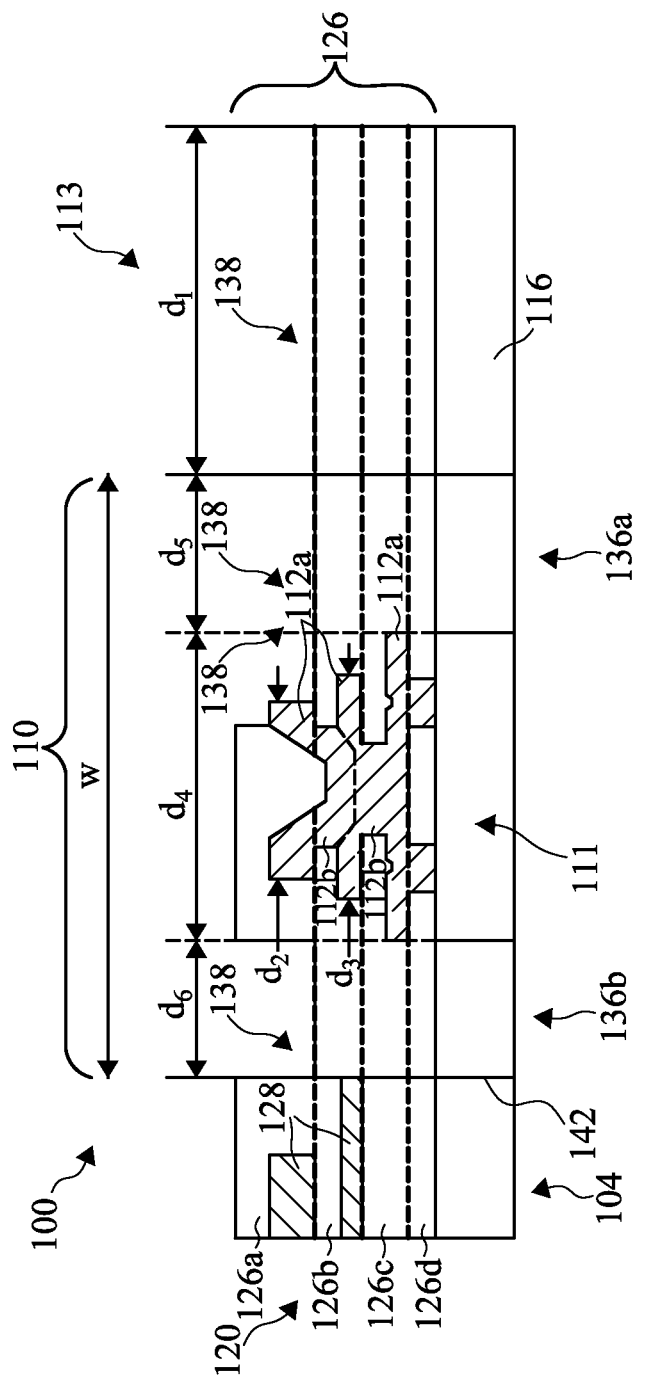
FIG. 20 is a cross-sectional view of a portion of a packaged semiconductor device shown in FIG. 17 in accordance with some embodiments.

FIG. 20 is a cross-sectional view of a portion of a packaged semiconductor device 100 shown in FIG. 17 in accordance with some embodiments. In some embodiments, the keep-out zone 136 shown in FIG. 18 in the perimeter region 110 comprises a first keep-out zone 136a, as shown in FIG. 20, and the packaged semiconductor device 100 also includes a second keep-out zone 136b in the perimeter region 110. The second keep-out zone 136b comprises a region disposed between the protection pattern 111 and the package edge 142. The second keep-out zone 136b comprises a region wherein no conductive features 112a or 112b of the protection pattern 111 are formed, and also wherein no conductive lines 128, conductive vias 130, or underball metallization (UBM) structures 132 (see FIG. 1) of the interconnect structure 120 are disposed or formed. A width of the second keep-out zone 136b may comprise dimension $d_6$. In some embodiments, the protection pattern 111 comprises a seal ring, and the keep-out zone 136b is disposed between the seal ring and the package edge 142, for example. The second keep-out zone 136b may or may not include a recess 138 in an upper portion of insulating materials 126.

Figure 21:
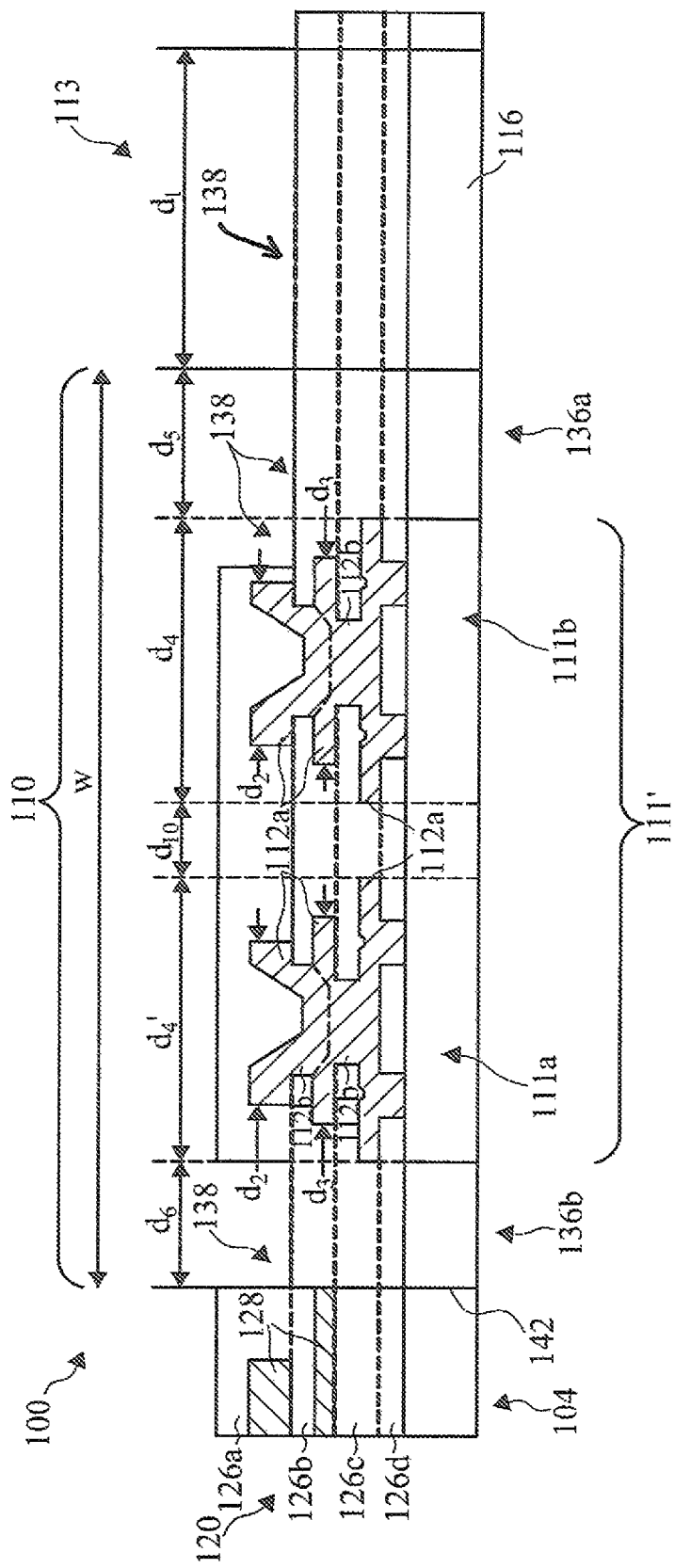
FIG. 21 is a cross-sectional view that illustrates a portion of a packaged semiconductor device that includes a protection pattern in accordance with some embodiments.
Figure 22:
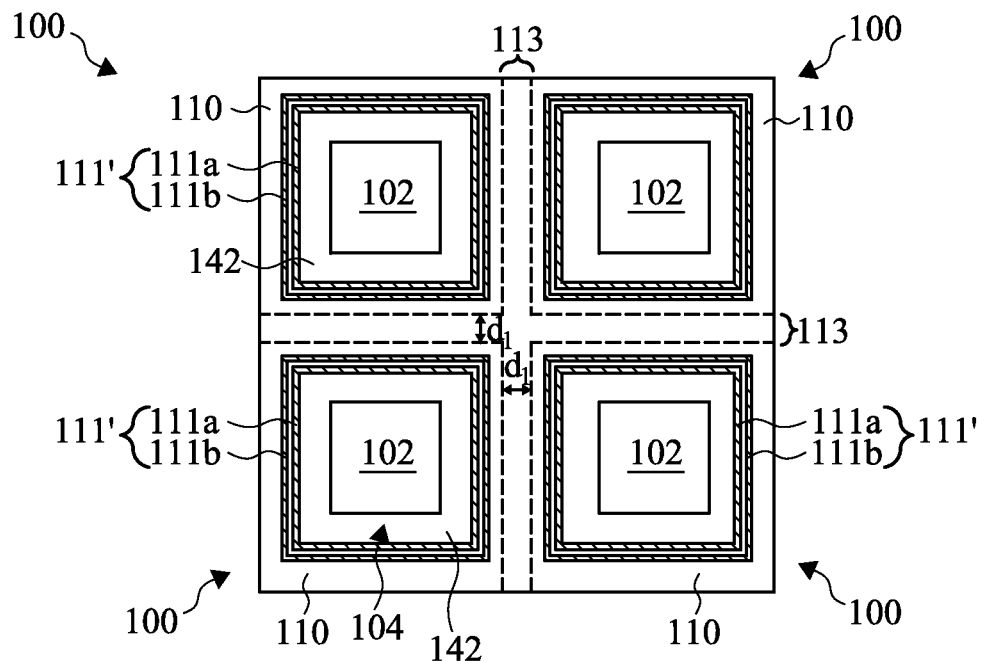
FIG. 22 is a top view that illustrates a plurality of packaged semiconductor devices that include the protection pattern shown in FIG. 21 in accordance with some embodiments.

FIG. 21 is a cross-sectional view of a portion of a packaged semiconductor device 100 that includes a protection pattern 111' in accordance with some embodiments, wherein the protection pattern 111' comprises a double seal ring. The protection pattern 111' comprises a first seal ring 111a disposed in the perimeter region 110 around the interconnect structure 120 over the integrated circuit die 102 (see FIG. 23), and a second seal ring 111b disposed around the first seal ring 111a. FIG. 22 is a top view that illustrates a plurality of packaged semiconductor devices 100 that include the protection patterns 111' shown in FIG. 21 in accordance with some embodiments. The first and second seal rings 111a and 111b comprise similar conductive features 112a and 112b and dimensions as described for the protection patterns 111 shown in FIGS. 17 through 20 in some embodiments, for example. The second seal ring 111b is spaced apart from the first seal ring 111a by a predetermined distance comprising a dimension $d_{10}$ in some embodiments, wherein dimension $d_{10}$ may comprise about 15 μm to about 25 μm, or about 20 μm in some embodiments. Dimension $d_{10}$ may also comprise other values. The packaged semiconductor devices 100 may or may not include first and second keep-out zones 136a and 136b with or without recesses 138 in insulating materials 126.

In some embodiments illustrated in FIGS. 21 and 22, the first seal ring 111a may comprise a smaller width than a width of the second seal ring 111a. For example, the second seal ring 111a may comprise similar dimensions as described for the protection pattern 111 shown in FIG. 17 through 20, and the first seal ring 111a may comprise a width comprising dimension $d_4'$, wherein dimension $d_4'$ is less than dimension $d_4$ of the second seal ring 111b. Dimension $d_4'$ of the first seal ring 111a may comprise about 15 μm to about 25 μm less than dimension $d_4$ of the second seal ring 111b, for example. Dimension $d_4'$ may comprise about 20 μm less than dimension $d_4$, as another example. Dimension $d_4'$ may also comprise other amounts relative to dimension $d_4$. In other embodiments, dimension $d_4'$ may be substantially the same as dimension $d_4$.

In some embodiments, the protection pattern 111 comprises the second seal ring 111b disposed around the first seal ring 111a, wherein the second seal ring 111b comprises a third conductive feature 112a disposed in a first material layer of the interconnect structure 120 and a fourth conductive feature 112a disposed in the second material layer of the interconnect structure 120, the third conductive feature 112a being coupled to the fourth conductive feature 112a (e.g., by a conductive feature 112b), and wherein the third conductive feature 112b comprises a third width and the fourth conductive feature 112 comprises a fourth width, the fourth width being greater than the third width. The third width may comprise dimension $d_2$, and the fourth width may comprise dimension $d_3$ in FIG. 21, for example.

FIG. 23 is a cross-sectional view of a packaged semiconductor device 100 that includes the protection pattern 111 in accordance with some embodiments. The protection pattern 111 is disposed in the perimeter region 110. The interconnect structure 120 may comprise a first interconnect structure 120a, and the packaged semiconductor device 100 may also include a second interconnect structure 120b disposed on an opposite side of the package from the first interconnect structure 120a. The second interconnect structure 120b is disposed over the molding material 116, the plurality of through-vias 106, and a back side of the integrated circuit die 102. In some embodiments, the second interconnect structure 120b is not included.

The molding material 116, the plurality of through-vias 106, and the interconnect structure 120a comprise a package for the integrated circuit die 102 in some embodiments. The protection pattern 111 is disposed in the perimeter region 110 of the package between a package edge 142 and a dicing path 113 (see FIG. 18) of the package, wherein the protection pattern 111 comprises a first conductive feature 112a disposed in a first material layer of the interconnect structure 120a and a second conductive feature 112a disposed in a second material layer of the interconnect structure 120a. The first conductive feature 112a is coupled to the second conductive feature 112a (e.g., by a conductive feature 112b). The first conductive feature 112a comprises a first width (e.g., comprising dimension $d_2$), and the second conductive feature 112a comprises a second width (e.g., comprising dimension $d_3$), the second width being greater than the first width.

In some embodiments, the conductive feature 112a of the protection pattern 111 in insulating material layer 126a (refer again to FIG. 18) is formed in a UBM layer of the interconnect structure 120a. The first conductive feature 112a disposed in a first material layer of the interconnect structure 120a is formed in a UBM layer of the interconnect structure 120a in some embodiments, for example. The conductive feature 112a of the protection pattern 111 in insulating material layer 126a comprises substantially a same shape as a UBM structure 132 of the interconnect structure 120a in some of these embodiments.

In some embodiments, a package for a semiconductor device includes an integrated circuit die mounting region 104, as shown in FIG. 23. The package includes the molding material 116 disposed around the integrated circuit die mounting region 104, and an interconnect structure 120a disposed over the molding material 116 and the integrated circuit die mounting region 104. The package includes a protection pattern 111 disposed in a perimeter region 110 of the package around the interconnect structure 120a, also illustrated in FIG. 23. The protection pattern 111 includes a first conductive feature 112a disposed vertically within the package proximate a second conductive feature 112a, wherein the first conductive feature 112a comprises a first width, and wherein the second conductive feature 112a comprises a second width, the second width being greater than the first width. In some embodiments, the first conductive feature 112a with the smaller first width is more proximate the molding material 116 than the second conductive feature 112a with the larger second width, as illustrated in FIGS. 5 and 7 (for example, see first width comprising dimension $a_2$ and second width comprising dimension $a_1$). In other embodiments, the second conductive feature 112a having the larger second width is more proximate the molding material 116 than the first conductive feature 112a having the smaller first width, as illustrated in FIGS. 18 through 21 (for example, see first width comprising dimension $d_2$ and second width comprising dimension $d_3$). In some embodiments, the protection pattern 111 of the package further comprises a third conductive feature 112a disposed vertically within the package proximate the second conductive feature 112a, wherein the third conductive feature 112a comprises a third width, the third width being greater than the second width, as illustrated in FIGS. 18 through 20 (for example, see third width comprising dimension $d_4$ and second width comprising dimension $d_3$).

The packaged semiconductor device 100 may be coupled to another packaged semiconductor device 150 as shown and described with reference to FIG. 15, to form a PoP device 170, in some embodiments. The PoP device 170 may also be coupled to a substrate 172 using connectors 122 to form an InFO device 174 in some embodiments, also shown in FIG. 15.

Figure 24:
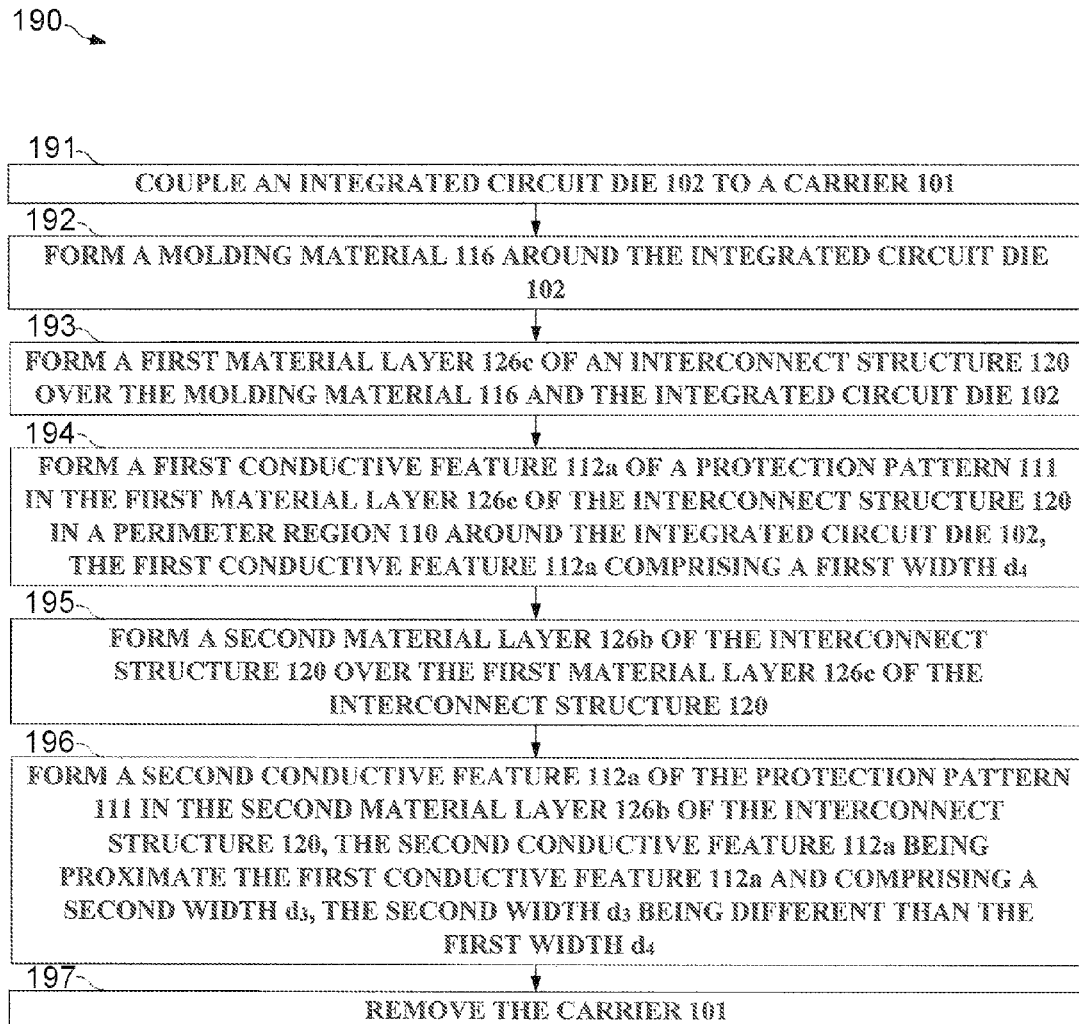
FIG. 24 is a flow chart that illustrates a method of packaging a semiconductor device in accordance with some embodiments of the present disclosure.

FIG. 24 is a flow chart 190 of a method of packaging a semiconductor device in accordance with some embodiments of the present disclosure. In step 191, an integrated circuit die 102 is coupled to a carrier 101, also shown in FIG. 1. In step 192, a molding material 116 is formed around the integrated circuit die 102 (see molding material 116 shown in FIG. 18 or 23). In step 193, a first material layer 126c of an interconnect structure 120 is formed over the molding material 116 and the integrated circuit die 102 (see also FIG. 18, wherein insulating material layer 126d is disposed over the molding material 116 and insulating material layer 126c is disposed over insulating material 126d). In step 194, a first conductive feature 112a of a protection pattern 111 is formed in the first material layer 126c of the interconnect structure 120 in a perimeter region 110 around the integrated circuit die 102, the first conductive feature 112a comprising a first width comprising dimension $d_4$, which is also shown in FIG. 18. In step 195, a second material layer 126b of the interconnect structure 120 is formed over the first material layer 126c of the interconnect structure 120, as shown in FIG. 18.

In step 196, a second conductive feature 112*a* of the protection pattern 111 is formed in the second material layer 126*b* of the interconnect structure 120, the second conductive feature 112*a* being proximate the first conductive feature 112*a* and comprising a second width comprising $d_3$, the second width comprising $d_3$ being different than the first width comprising $d_4$. For example, in FIG. 18, dimension $d_3$ is less than dimension $d_4$. The second-formed first conductive feature 112*a* may also have a width that is greater than the first-formed first conductive feature 112*a*, as illustrated in FIGS. 5 and 7. In step 197, the carrier 101 is removed.

In some embodiments, a packaging method for a semiconductor device further comprises coupling a plurality of integrated circuit dies 102 to the carrier 101, and forming the molding material 116 around each of the plurality of integrated circuit dies 102. The first material layer 126*c* of the interconnect structure 120 and the second material layer 126*b* of the interconnect structure 120 are formed over each of the plurality of integrated circuit dies 102. Forming the first conductive feature 112*a* of the protection pattern 111 and forming the second conductive feature 112*a* of the protection pattern 111 may comprise forming a protection pattern 111 in a perimeter region 110 of each of the plurality of integrated circuit dies 102. A packaging method for a semiconductor device may also comprise separating the plurality of packaged integrated circuit dies 102 along the dicing paths 113 proximate the protection patterns 111 to form a plurality of separated packaged semiconductor devices 100.

A packaging method may also comprise simultaneously forming the first conductive feature 112 of the protection pattern 111 with the forming of the first material layer 126*c* of the interconnect structure 120 and/or simultaneously forming the second conductive feature 112*a* of the protection pattern 111 with the forming of the second material layer 126*b* of the interconnect structure 120, in some embodiments.

In other embodiments, forming the molding material 116 around the integrated circuit die 102, forming the first material layer 126*c* of the interconnect structure 120, forming the first conductive feature 112*a* of the protection pattern 111, forming the second material layer 126*b* of the interconnect structure 120, and forming the second conductive feature 112*a* of the protection pattern 111 comprises packaging the integrated circuit die 102 to form a packaged semiconductor device 100. In some embodiments, the packaged semiconductor device 100 is aligned using the protection pattern 111, such as alignment of the packaged semiconductor device 100 to a carrier or other type of object.

Some embodiments of the present disclosure include packages for semiconductor devices, and methods of packaging semiconductor devices. Other embodiments include packaged semiconductor devices 100 that have been packaged using the novel methods described herein.

Some advantages of embodiments of the present disclosure include providing novel packaging structures and methods wherein protection patterns are included in perimeter regions of packaged semiconductor devices to provide protection for interconnect structure material layers during a dicing process along a dicing path. No additional packaging process steps, lithography masks, lithography processes, or costs may be required to include the protection patterns in semiconductor device packages. The protection patterns comprise metal patterns that are added at outer edge of the packages.

The protection patterns prevent or reduce cracking and chipping of conductive material layers and insulating material layers of the interconnect structures, and thus improve yields, provide a cost savings, and result in improved quality. The protection patterns also function as guides during the dicing process, providing improved control. The protection patterns further function as alignment patterns during the dicing process and other processing steps of the packaging process flow, such as alignment marks for a subsequent pick-and-place process used to place the packaged semiconductor devices onto a carrier or other object. Furthermore, the protection patterns and novel packaging methods and structures described herein are easily implementable in manufacturing and packaging process flows.

Some embodiments of the present disclosure wherein the conductive features of the protection patterns comprise a tiered shape, wherein widths of the conductive features are successively tapered or tiered from one side of the package to an opposite side, such as from the top side to the bottom side, or the bottom side to the top side, are particularly advantageous for providing stress shielding for the package. The tapered or tiered structure of conductive features of the protection patterns may prevent vertical cracks or delamination propagation along sidewalls between the conductive features and insulating material layers in some embodiments. The tapered or tiered structure of conductive features of the protection patterns may interrupt cracks and/or delamination propagation during a die sawing process, for example. In some embodiments, one or more keep-out zones may be included in the perimeter region proximate the protection pattern, and recesses may or may not be included in the keep-out zones. The keep-out zones and recesses advantageously provide further protection and prevention from chipping and delamination of the package materials at the package edges. The keep-out zones also may reduce or prevent radio frequency (RF) noise interference and reduce stress, in some embodiments.

In some embodiments, a package for a semiconductor device includes an integrated circuit die mounting region, a molding material disposed around the integrated circuit die mounting region, and an interconnect structure disposed over the molding material and the integrated circuit die mounting region. A protection pattern is disposed in a perimeter region of the package. The protection pattern comprises a conductive feature.

In some embodiments, a packaged semiconductor device includes a molding material, an integrated circuit die disposed within the molding material, and an interconnect structure disposed over the molding material and the integrated circuit die. The molding material and the interconnect structure comprise a package for the integrated circuit die. A protection pattern is disposed in a perimeter region of the package. The protection pattern comprises a plurality of conductive features. The protection pattern is disposed between a package edge and a dicing path of the package.

In other embodiments, a method of packaging a semiconductor device includes coupling an integrated circuit die to a carrier, forming a molding material around the integrated circuit die, and forming an interconnect structure over the molding material and the integrated circuit die. The interconnect structure and the molding material comprise a package for the integrated circuit die. The method includes forming a protection pattern in a perimeter region of the package, wherein the protection pattern comprises a conductive feature. The carrier is removed.

In some embodiments, a package for a semiconductor device includes an integrated circuit die mounting region, a molding material disposed around the integrated circuit die mounting region, and an interconnect structure disposed over the molding material and the integrated circuit die mounting region. A protection pattern is disposed in a perimeter region of the package around the interconnect structure. The protection pattern includes a first conductive feature disposed vertically within the package proximate a second conductive feature. The first conductive feature has a first width, and the second conductive feature has a second width, the second width being greater than the first width.

In other embodiments, a packaged semiconductor device includes a molding material, an integrated circuit die disposed within the molding material, a plurality of through-vias disposed within the molding material, and an interconnect structure disposed over the molding material, the plurality of through-vias, and the integrated circuit die. The molding material, plurality of through-vias, and the interconnect structure comprise a package for the integrated circuit die. A protection pattern is disposed in a perimeter region of the package between a package edge and a dicing path of the package. The protection pattern includes a first conductive feature disposed in a first material layer of the interconnect structure and a second conductive feature disposed in a second material layer of the interconnect structure. The first conductive feature is coupled to the second conductive feature. The first conductive feature has a first width, and the second conductive feature has a second width. The second width is greater than the first width.

In other embodiments, a method of packaging a semiconductor device includes coupling an integrated circuit die to a carrier, forming a molding material around the integrated circuit die, and forming a first material layer of an interconnect structure over the molding material and the integrated circuit die. A first conductive feature of a protection pattern is formed in the first material layer of the interconnect structure in a perimeter region around the integrated circuit die, the first conductive feature comprising a first width. The method includes forming a second material layer of the interconnect structure over the first material layer of the interconnect structure, and forming a second conductive feature of the protection pattern in the second material layer of the interconnect structure. The second conductive feature is proximate the first conductive feature and has a second width, the second width being different than the first width. The carrier is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package for a semiconductor device, comprising:
   an integrated circuit die mounting region;
   a molding material disposed around the integrated circuit die mounting region;
   an interconnect structure disposed over the molding material and the integrated circuit die mounting region; and
   a protection pattern disposed over and outside the molding material in a perimeter region of the package around the interconnect structure, wherein the protection pattern comprises a first conductive feature disposed vertically within the package proximate a second conductive feature, wherein the first conductive feature and the second conductive feature inside the protection pattern are electrically isolated from conductive features outside the protection pattern, wherein the first conductive feature comprises a first width, wherein the second conductive feature comprises a second width, the second width being greater than the first width, wherein the first width and the second width are measured orthogonally to the first conductive feature disposed vertically.

2. The package according to claim 1, wherein the protection pattern further comprises a third conductive feature disposed vertically within the package proximate the second conductive feature, and wherein the third conductive feature comprises a third width, the third width being greater than the second width.

3. The package according to claim 2, wherein the third conductive feature is more proximate the molding material than the second conductive feature.

4. The package according to claim 1, wherein the first conductive feature is more proximate the molding material than the second conductive feature.

5. The package according to claim 1, wherein the second conductive feature is more proximate the molding material than the first conductive feature.

6. The package according to claim 1, wherein the second width is greater than the first width by about 1 μm to about 20 μm.

7. The package according to claim 1, wherein the first width or the second width comprise about 60 μm or less.

8. The package according to claim 1, wherein at least one of the first conductive feature or the second conductive feature comprises of non-continuous via bars.

9. The package according to claim 1, wherein the perimeter region of the package is disposed between a package edge and a dicing path.

10. A packaged semiconductor device, comprising:
    a molding material;
    an integrated circuit die disposed within the molding material;
    a plurality of through-vias disposed within the molding material;
    an interconnect structure disposed over the molding material, the plurality of through-vias, and the integrated circuit die, wherein the molding material, plurality of through-vias, and the interconnect structure comprise a package for the integrated circuit die; and
    a protection pattern disposed in a perimeter region of the package between a package edge and a dicing path of the package, wherein the protection pattern comprises a first conductive feature disposed in a first material layer of the interconnect structure and a second conductive feature disposed in a second material layer of the interconnect structure, the first conductive feature being coupled to the second conductive feature, wherein the first conductive feature comprises a first width, wherein the second conductive feature comprises a second width, the second width being greater than the first width.

11. The packaged semiconductor device according to claim 10, wherein the first material layer of the interconnect structure comprises an underball metallization (UBM) layer.

12. The packaged semiconductor device according to claim 11, wherein the first conductive feature of the protection pattern substantially comprises a shape of a UBM structure in the UBM layer of the interconnect structure.

13. The packaged semiconductor device according to claim 10, wherein the first conductive feature is disposed over the second conductive feature, and wherein the first conductive feature and the second conductive feature are substantially concentric.

14. The packaged semiconductor device according to claim 10, wherein the protection pattern comprises a seal ring disposed around the package, and wherein the seal ring is continuous.

15. The packaged semiconductor device according to claim 14, wherein the seal ring comprises a first seal ring, wherein the protection pattern comprises a second seal ring disposed around the first seal ring, wherein the second seal ring comprises a third conductive feature disposed in the first material layer of the interconnect structure and a fourth conductive feature disposed in the second material layer of the interconnect structure, the third conductive feature being coupled to the fourth conductive feature, and wherein the third conductive feature comprises a third width and the fourth conductive feature comprises a fourth width, the fourth width being greater than the third width.

16. The packaged semiconductor device according to claim 14, further comprising a keep-out zone disposed between the seal ring and the dicing path, wherein the first conductive feature and the second conductive feature of the protection pattern are not disposed within the keep-out zone.

17. The packaged semiconductor device according to claim 16, wherein the keep-out zone comprises a first keep-out zone, wherein the packaged semiconductor device further comprises a second keep-out zone disposed between the seal ring and the package edge, wherein the first conductive feature and the second conductive feature of the protection pattern are not disposed in the second keep-out zone, and wherein conductive lines, conductive vias, or underball metallization (UBM) structures of the interconnect structure are not disposed in the second keep-out zone.

18. The packaged semiconductor device according to claim 17, further comprising a recess disposed in an insulating material layer of the first keep-out zone or the second keep-out zone.

19. A package for a semiconductor device, comprising:
a plurality of integrated circuit die regions, respective ones of the plurality of integrated circuit die regions being separated from adjacent ones of the plurality of integrated circuit die regions by respective scribe lines;
a molding material disposed around the integrated circuit die regions;
respective interconnect structures disposed over the molding material and the respective integrated circuit die regions; and
respective protection patterns disposed in respective perimeter regions of the package around respective interconnect structures, wherein the respective protection patterns comprise a vertically aligned tier of conductive features disposed within the package, each conductive feature in the vertically aligned tier having a width, measured along a plane that is parallel to a major top surface of the molding material, that is greater than a width of an immediately vertically adjacent conductive feature of the vertically aligned tier of conductive features.

20. The package according to claim 19, wherein a portion of a lowest conductive feature of the vertically aligned tier of conductive features is at least partially embedded in the molding material.

21. The package according to claim 19, wherein the vertically aligned tier of conductive features is spaced apart from an adjacent scribe line by a keep-out zone in which no conductive features are formed.

22. The package according to claim 19, wherein respective protection patterns comprise respective continuous seal rings disposed around respective integrated circuit die regions.

* * * * *